(12) United States Patent
Kim

(10) Patent No.: US 12,489,087 B2
(45) Date of Patent: Dec. 2, 2025

(54) SEMICONDUCTOR PACKAGE

(71) Applicant: Samsung Electronics Co., Ltd., Suwon-si (KR)

(72) Inventor: Kwang-Soo Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 485 days.

(21) Appl. No.: 17/897,181

(22) Filed: Aug. 28, 2022

(65) Prior Publication Data

US 2023/0238359 A1 Jul. 27, 2023

(30) Foreign Application Priority Data

Jan. 21, 2022 (KR) .................. 10-2022-0009384

(51) Int. Cl.
*H01L 25/065* (2023.01)
*H01L 23/00* (2006.01)
(Continued)

(52) U.S. Cl.
CPC .... *H01L 25/0657* (2013.01); *H01L 23/49816* (2013.01); *H01L 23/49838* (2013.01); *H01L 23/5283* (2013.01); *H01L 23/5286* (2013.01); *H01L 24/06* (2013.01); *H01L 24/32* (2013.01); *H01L 24/48* (2013.01); *H01L 24/73* (2013.01); *H01L 2224/0235* (2013.01); *H01L 2224/02373* (2013.01); *H01L 2224/02375* (2013.01); *H01L 2224/02381* (2013.01); *H01L 2224/024* (2013.01); *H01L 2224/06131* (2013.01); *H01L 2224/32145* (2013.01); *H01L 2224/32225* (2013.01); *H01L 2224/48227* (2013.01); *H01L 2224/73215* (2013.01); *H01L 2224/73265* (2013.01); *H01L 2225/0651* (2013.01); *H01L 2225/06524* (2013.01);
(Continued)

(58) Field of Classification Search
CPC ................................. H01L 2224/023
See application file for complete search history.

(56) References Cited

U.S. PATENT DOCUMENTS 7,994,621 B2   8/2011   Kim
9,502,345 B2   11/2016  Youn et al.
(Continued)

FOREIGN PATENT DOCUMENTS

| JP | 3896038 B2 | 3/2007 |
| KR | 101099578 B1 | 12/2011 |
| KR | 1020210103307 A | 8/2021 |

*Primary Examiner* — Yu-Hsi D Sun
(74) *Attorney, Agent, or Firm* — Muir Patent Law, PLLC

(57) ABSTRACT

Disclosed is a semiconductor package comprising a substrate that includes a plurality of substrate pads on a top surface of the substrate, a first semiconductor chip on the substrate, a second semiconductor chip on the first semiconductor chip, and a plurality of first bonding wires on a top surface of the first semiconductor chip and coupled to the substrate pads. The first semiconductor chip includes a first lower signal pad, a second lower signal pad laterally spaced apart from the first lower signal pad, and a lower signal redistribution pattern electrically connected to the first lower signal pad and the second lower signal pad. One of the first bonding wires is coupled to the first lower signal pad. Any of the first bonding wires is not on a top surface of the second lower signal pad.

20 Claims, 18 Drawing Sheets

(51) Int. Cl.
 *H01L 23/498* (2006.01)
 *H01L 23/528* (2006.01)
(52) U.S. Cl.
 CPC ............... *H01L 2225/06562* (2013.01); *H01L 2924/1431* (2013.01); *H01L 2924/1436* (2013.01); *H01L 2924/1438* (2013.01)

(56) References Cited

U.S. PATENT DOCUMENTS

| | | |
|---|---|---|
| 10,403,605 B2 | 9/2019 | Nakase et al. |
| 10,756,062 B2 | 8/2020 | Kim et al. |
| 2017/0062387 A1* | 3/2017 | Hong ................. H01L 25/0657 |
| 2020/0381399 A1 | 12/2020 | Choi |

* cited by examiner

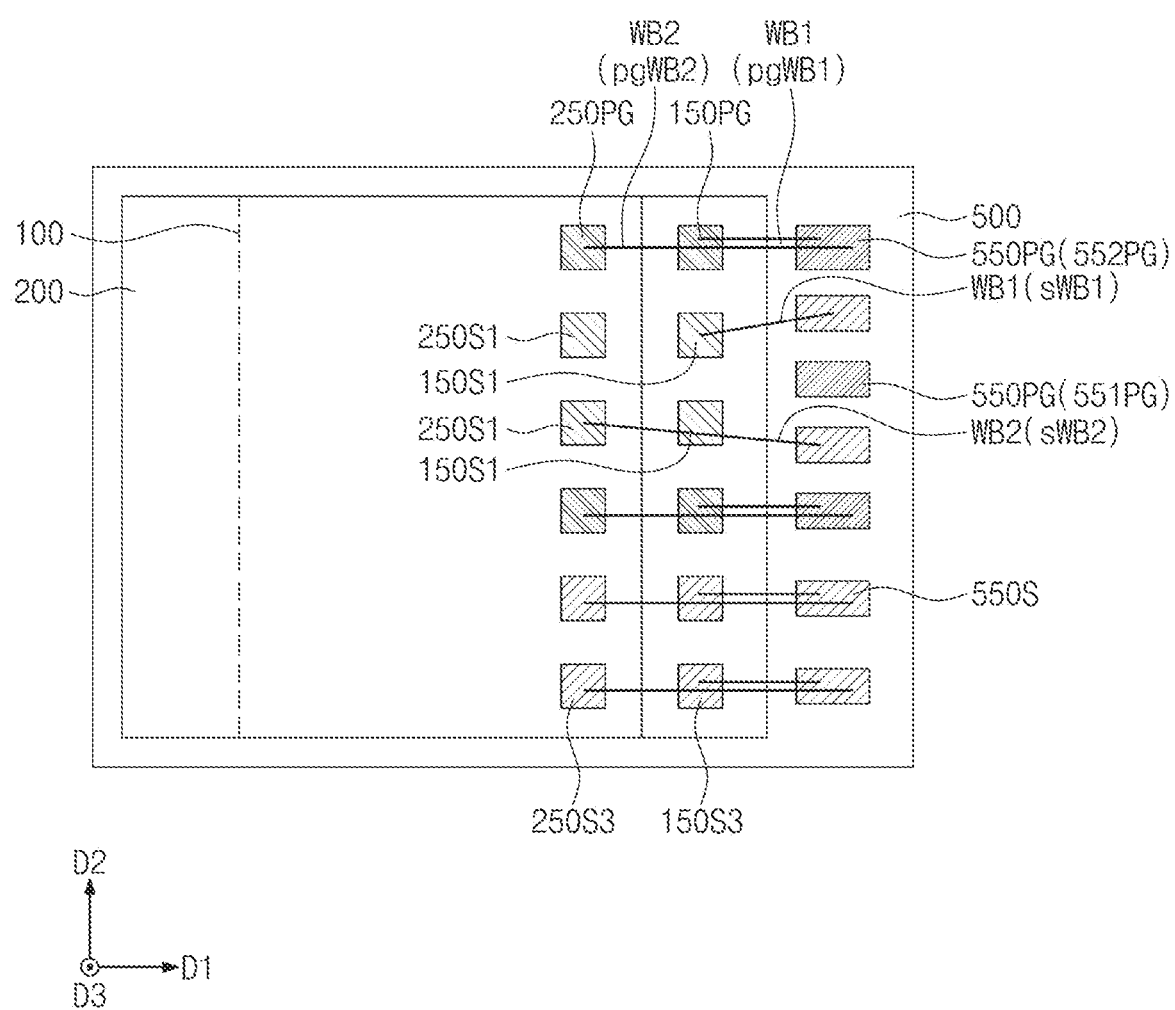

SEMICONDUCTOR PACKAGE

CROSS-REFERENCE TO RELATED APPLICATION

This U.S. nonprovisional application claims priority under 35 U.S.C. § 119 to Korean Patent Application No. 10-2022-0009384, filed on Jan. 21, 2022, in the Korean Intellectual Property Office, the disclosure of which is hereby incorporated by reference in its entirety.

BACKGROUND

The present inventive concepts relate to a semiconductor package, and more particularly, to a semiconductor package including stacked semiconductor chips.

A semiconductor package is provided to implement an integrated circuit chip to qualify for use in electronic products. A semiconductor package is typically configured such that a semiconductor chip is mounted on a printed circuit board and bonding wires or bumps are used to electrically connect the semiconductor chip to the printed circuit board.

SUMMARY

Some embodiments of the present inventive concepts provide a semiconductor package with increased operating reliability and improved electrical properties.

According to some embodiments of the present inventive concepts, a semiconductor package may comprise: a substrate that includes a plurality of substrate pads on a top surface of the substrate; a first semiconductor chip on the substrate; a second semiconductor chip on the first semiconductor chip; and a plurality of first bonding wires on a top surface of the first semiconductor chip and coupled to the substrate pads. The first semiconductor chip may include: a first lower signal pad; a second lower signal pad laterally spaced apart from the first lower signal pad; and a lower signal redistribution pattern electrically connected to the first lower signal pad and the second lower signal pad. One of the first bonding wires may be coupled to the first lower signal pad. Any of the first bonding wires may not be on a top surface of the second lower signal pad.

According to some embodiments of the present inventive concepts, a semiconductor package may comprise: a substrate that includes a plurality of substrate pads on a top surface of the substrate; a first semiconductor chip on the substrate, the first semiconductor chip including a first lower signal pad, a second lower signal pad, and a lower redistribution pattern; a second semiconductor chip on the first semiconductor chip, the second semiconductor chip including a first upper signal pad, a second upper signal pad, and an upper redistribution pattern; a plurality of first bonding wires on a top surface of the first semiconductor chip and coupled to the substrate; and a plurality of second bonding wires on a top surface of the second semiconductor chip and coupled to the substrate. The lower redistribution pattern may be electrically connected to the first lower signal pad and the second lower signal pad. The upper redistribution pattern may be electrically connected to the first upper signal pad and the second upper signal pad. The first bonding wires may be spaced apart from the second lower signal pad. The second bonding wires may be spaced apart from the first upper signal pad.

According to some embodiments of the present inventive concepts, a semiconductor package may comprise: a substrate that includes a plurality of substrate pads on a top surface of the substrate, the substrate pads including a plurality of signal substrate pads and a plurality of power/ground substrate pads; a plurality of solder balls on a bottom surface of the substrate; a first semiconductor chip on the top surface of the substrate; a second semiconductor chip on a top surface of the first semiconductor chip; a plurality of first bonding wires on the top surface of the first semiconductor chip and coupled to the substrate; a plurality of second bonding wires on a top surface of the second semiconductor chip and coupled to the substrate; and a molding layer on the top surface of the substrate, the molding layer covering the first and second semiconductor chips. The first semiconductor chip may include: a first lower signal pad; a second lower signal pad laterally spaced apart from the first lower signal pad; a lower redistribution pattern coupled to the first and second lower signal pads; and a first power/ground pad insulated from the first and second lower signal pads. The second semiconductor chip may include: a first upper signal pad; a second upper signal pad laterally spaced apart from the first upper signal pad; an upper redistribution pattern coupled to the first and second upper signal pads; and a second power/ground pad insulated from the first and second upper signal pads. The second bonding wires may include a second signal bonding wire connected to the second upper signal pad. The second bonding wires may be spaced apart from the first upper signal pad.

BRIEF DESCRIPTION OF THE DRAWINGS

FIG. 5C illustrates a plan view showing a semiconductor package, according to example embodiments.

DETAIL PORTIONED DESCRIPTION OF EMBODIMENTS

Figure 1A:
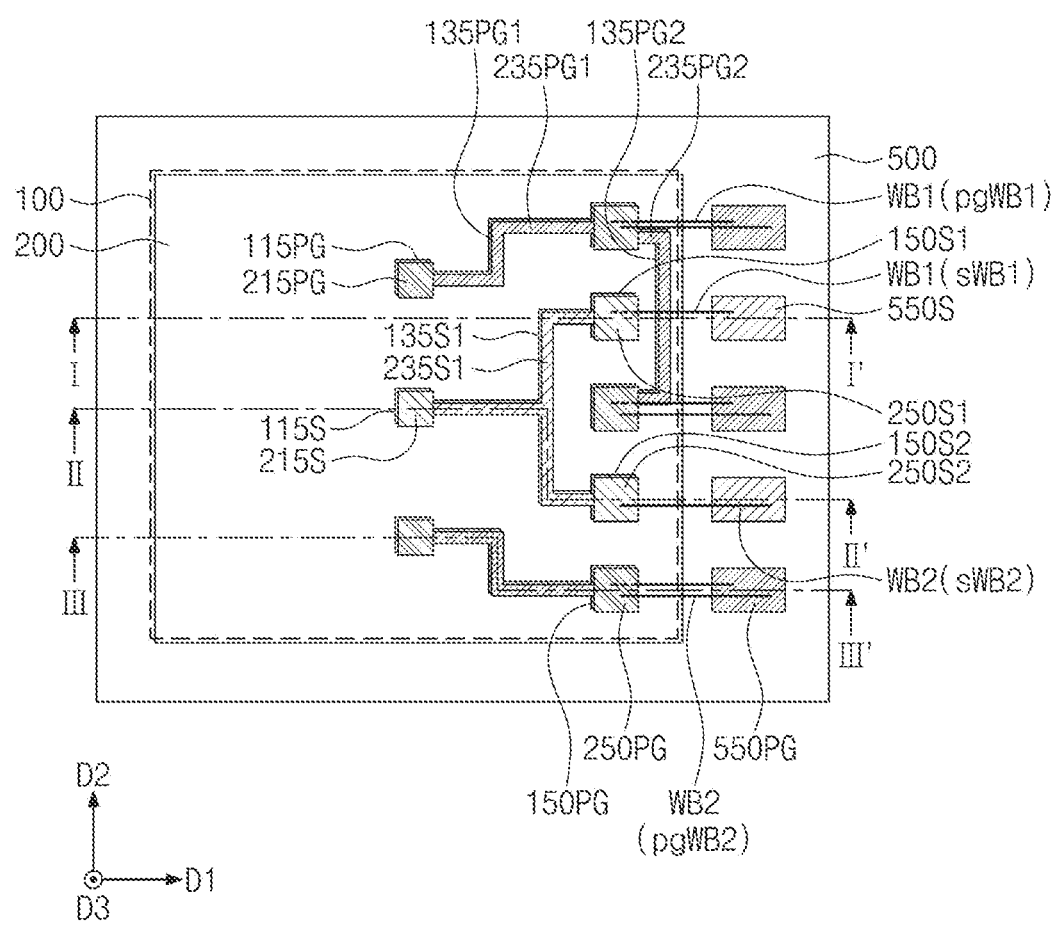
FIG. 1A illustrates a plan view showing a semiconductor package, according to example embodiments.

In this description, like reference numerals refer to like components. The following will now describe semiconductor packages according to the present inventive concepts.

As used herein, terms such as "same," "equal," "planar," or "coplanar," when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Figure 1B:
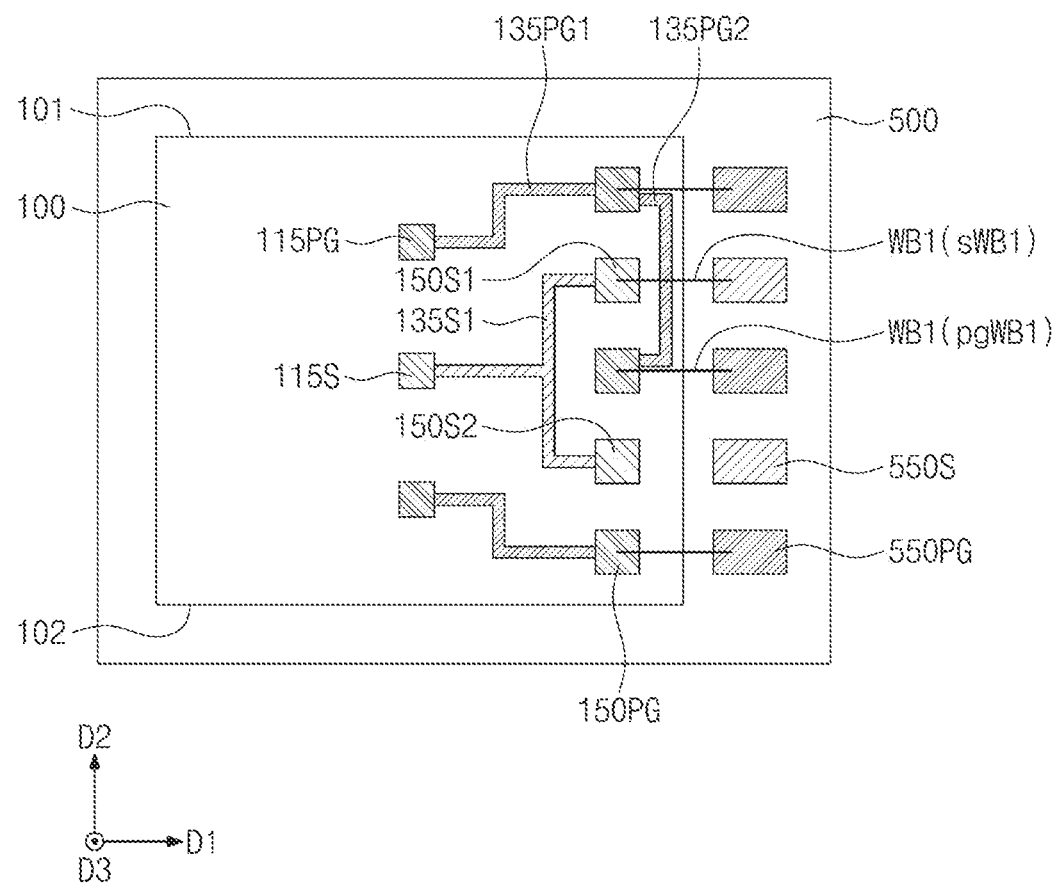
FIG. 1B illustrates a plan view showing an arrangement of a substrate, a first semiconductor chip, and a first bonding wire, according to example embodiments.
Figure 1C:
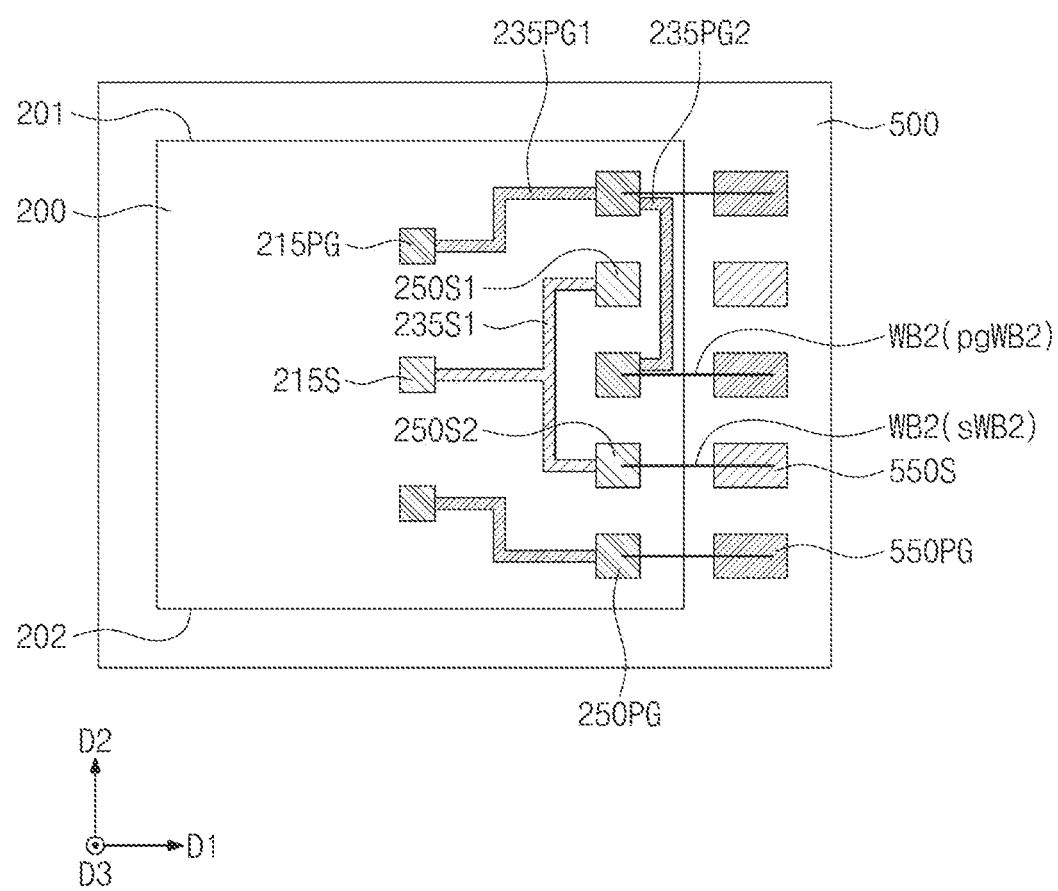
FIG. 1C illustrates a plan view showing an arrangement of a substrate, a second semiconductor chip, and a second bonding wire, according to example embodiments.
Figure 1D:
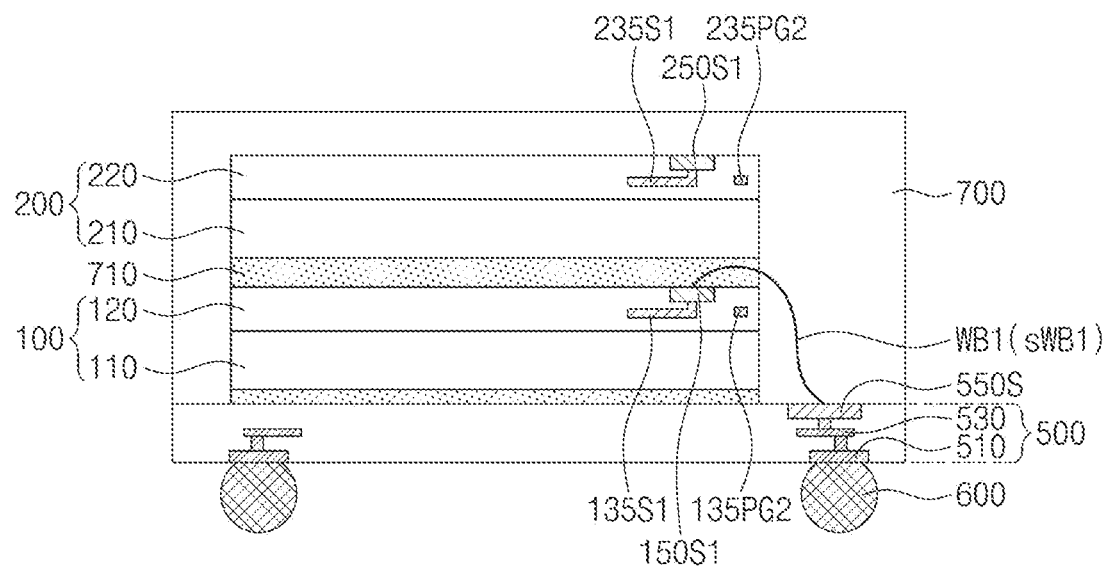
FIG. 1D illustrates a cross-sectional view taken along line I-I' of FIG. 1A.
Figure 1E:
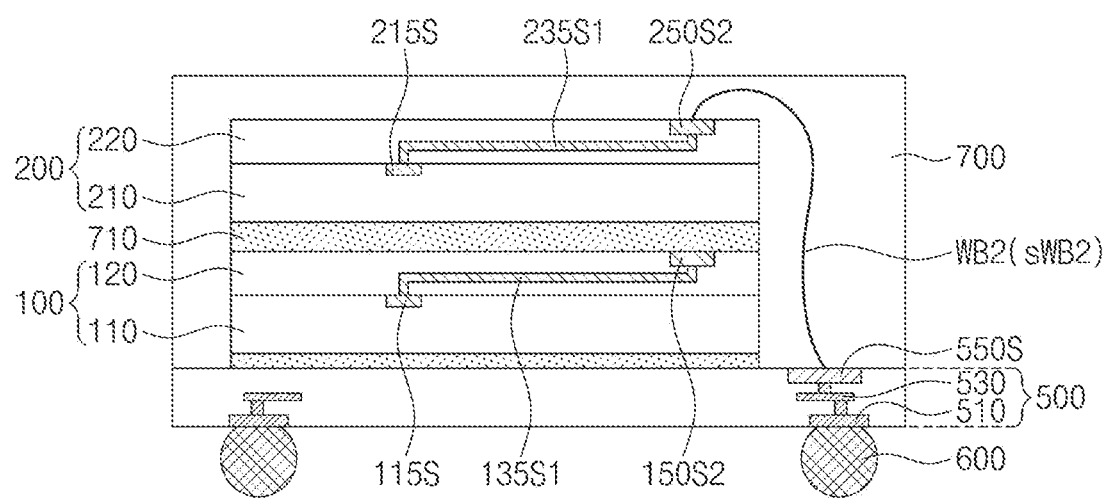
FIG. 1E illustrates a cross-sectional view taken along line II-II' of FIG. 1A.
Figure 1F:
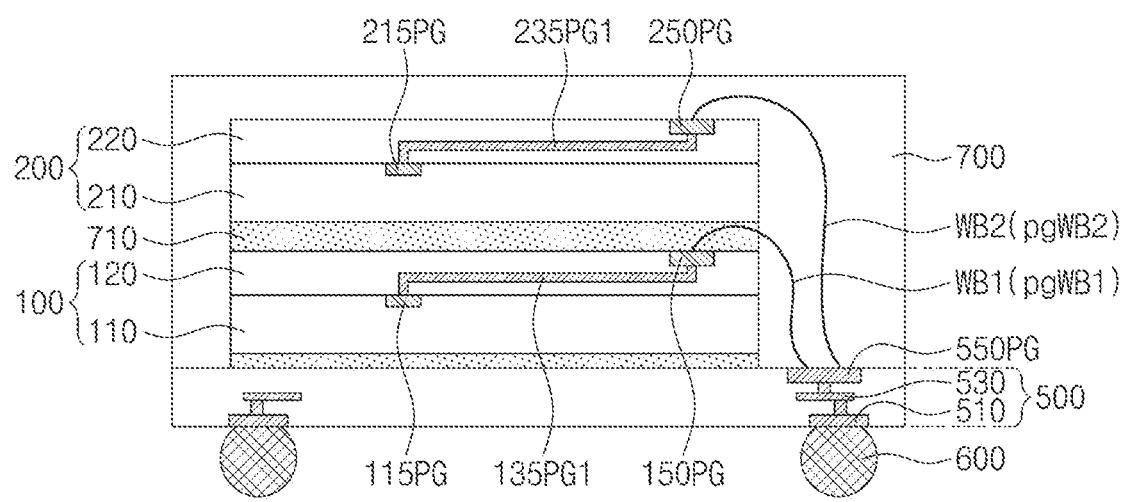
FIG. 1F illustrates a cross-sectional view taken along line III-III' of FIG. 1A.

FIG. 1A illustrates a plan view showing a semiconductor package according to example embodiments. FIG. 1B illustrates a plan view showing an arrangement of a substrate, a first semiconductor chip, and a first bonding wire according to example embodiments. FIG. 1C illustrates a plan view showing an arrangement of a substrate, a second semiconductor chip, and a second bonding wire according to example embodiments. FIG. 1D illustrates a cross-sectional view taken along line I-I' of FIG. 1A. FIG. 1E illustrates a cross-sectional view taken along line II-II' of FIG. 1A. FIG. 1F illustrates a cross-sectional view taken along line III-III' of FIG. 1A.

In plan views of FIGS. 1A to 1C, 2A to 2C, 4A, 5A, 5C, 6B, and 6C according to the present inventive concepts, bonding wires coupled to corresponding signal substrate pads 550S are illustrated spaced apart for discriminating from each other, but bonding wires coupled to the same signal substrate pad 550S may overlap each other when viewed in plan. Likewise, bonding wires coupled to corresponding power/ground substrate pads 550PG are illustrated spaced apart for discriminating from each other, but bonding wires coupled to the same signal substrate pad 550S may overlap each other when viewed in plan.

Referring to FIGS. 1A to 1F, a semiconductor package may include a substrate 500, a first semiconductor chip 100, a second semiconductor chip 200, first bonding wires WB1, and second wire bonding wires WB2.

As illustrated in FIGS. 1A and 1D, the substrate 500 may include signal substrate pads 550S, power/ground substrate pads 550PG, lower substrate pads 510, and substrate wiring lines 530. For example, the substrate 500 may be a printed circuit board (PCB). The signal substrate pads 550S and the power/ground substrate pads 550PG may be provided on a top surface of the substrate 500. In example embodiments, top surfaces of the signal substrate pads 550S and the power/ground substrate pads 550PG may be coplanar with the top surface of the substrate 500. The signal substrate pads 550S may serve as paths through which data signals are input to and output from the first semiconductor chip 100 or the second semiconductor chip 200. The power/ground substrate pads 550PG may be disposed laterally spaced apart from the signal substrate pads 550S.

The phrase "certain components are laterally spaced apart from each other" may mean that "certain components are horizontally spaced apart from each other." The term "horizontally" may indicate the meaning of "parallel to the top surface of the substrate 500." The power/ground substrate pads 550PG may be electrically insulated from the signal substrate pads 550S. At least one of the power/ground substrate pads 550PG may be provided between the signal substrate pads 550S. The power/ground substrate pads 550PG may each serve as a path through which a voltage is delivered to the first semiconductor chip 100 or the second semiconductor chip 200.

The voltage may be a power voltage or a ground voltage. When viewed in plan, the signal substrate pads 550S and the power/ground substrate pads 550PG may be aligned along a second direction D2. The phrase "electrically connected to the substrate 500" may mean that "electrically connected to one of the signal substrate pads 550S and the power/ground substrate pads 550PG." The phrase "two components are electrically connected/coupled to each other" may include that "the two components are directly connected to each other or indirectly connected to each other through other conductive component(s)."

The substrate wiring lines 530 may be provided in the substrate 500, and may be coupled to the signal substrate pads 550S and the power/ground substrate pads 550PG. The substrate wiring lines 530 may include vias and lines. The lower substrate pads 510 may be provided on a bottom surface of the substrate 500. In example embodiments, bottom surfaces of the lower substrate pads 510 may be coplanar with the bottom surface of the substrate 500. The lower substrate pads 510 may be electrically connected through the substrate wiring lines 530 to the signal substrate pads 550S and/or the power/ground substrate pads 550PG. The signal substrate pads 550S, the power/ground substrate pads 550PG, the substrate wiring lines 530, and the lower substrate pads 510 may include metal, such as one or more of aluminum, copper, tungsten, and titanium.

A first direction D1 may be parallel to the top surface of the substrate 500. The second direction D2 may be parallel to the top surface of the substrate 500 and substantially orthogonal to the first direction D1. A third direction D3 may be substantially perpendicular to the top surface of the substrate 500 and orthogonal to the first and second directions D1 and D2.

The semiconductor package may further include solder balls 600. The solder balls 600 may be provided on the bottom surface of the substrate 500. For example, the solder balls 600 may be coupled to bottom surfaces of the lower substrate pads 510. In example embodiments, the solder balls 600 may contact the lower substrate pads 510. The solder balls 600 may include metal, such as a solder material. The solder material may include, for example, one or more of tin, silver, zinc, and any alloy thereof.

The first semiconductor chip 100 may be disposed on the top surface of the substrate 500. The first semiconductor chip 100 may include, for example, a memory chip such as DRAM and NAND. Alternatively, the first semiconductor chip 100 may include, for example, a logic chip or a buffer chip.

As illustrated in FIG. 1B, the first semiconductor chip 100 may have a first lateral surface 101, a second lateral surface 102, and a third lateral surface. The second lateral surface 102 of the first semiconductor chip 100 may face the first lateral surface 101 of the first semiconductor chip 100. The first and second lateral surfaces 101 and 102 of the first semiconductor chip 100 may be parallel to the first direction D1. The third lateral surface of the first semiconductor chip 100 may neighbor the first lateral surface 101 and the second lateral surface 102. For example, the third lateral surface may extend between the first lateral surface 101 and the second lateral surface 102, and may connect the first lateral surface 101 and the second lateral surface 102. The third lateral surface of the first semiconductor chip 100 may be parallel to the second direction D2. The first lateral surface 101, the second lateral surface 102, and the third lateral surface may also be referred to as a first sidewall 101, a second sidewall 102, and a third sidewall, respectively.

As illustrated in FIGS. 1B, 1D, 1E, and 1F, the first semiconductor chip 100 may include a first semiconductor substrate 110, a first redistribution layer 120, a first lower signal pad 150S1, a second lower signal pad 150S2, and first power/ground pads 150PG. The first semiconductor chip 100 may further include first integrated circuits, a first wiring layer, and first metal pads. The first semiconductor substrate 110 may be a first semiconductor die. The first semiconductor substrate 110 may include silicon or silicon-germanium. The first integrated circuits may be provided on the first semiconductor substrate 110. The first wiring layer may be provided on the first semiconductor substrate 110 and may be coupled to the first integrated circuits. The first wiring layer may include at least one selected from a front-end-of-line (FEOL) layer and a back-end-of-line (BEOL) layer. The first metal pads may include a first signal metal pad 115S and first power/ground metal pads 115PG. The first signal metal pad 115S and the first power/ground metal pads 115PG may be provided on the first wiring layer. The first signal metal pad 115S and the first power/ground metal pads 115PG may be center pads.

When viewed in plan, the first signal metal pad 115S and the first power/ground metal pads 115PG may overlap a central region of the first semiconductor chip 100. The first signal metal pad 115S and the first power/ground metal pads 115PG may be electrically connected to the first integrated circuits through first metal lines in the first wiring layer. The phrase "electrically connected to a semiconductor chip" may mean that "electrically connected to integrated circuits of the semiconductor chip." The first signal metal pad 115S may be laterally spaced apart and electrically insulated from the first power/ground metal pads 115PG.

The first redistribution layer 120 may be provided on a top surface of the first semiconductor substrate 110. The first wiring layer may be provided between the first semiconductor substrate 110 and the first redistribution layer 120. The first redistribution layer 120 may include a first dielectric layer and first redistribution patterns. The first dielectric layer may be a single layer or a multiple layer. The first dielectric layer may include a photo-imageable dielectric (PID) material or a dielectric polymer. Alternatively, the first redistribution layer 120 may be at least a portion of the BEOL layer. In this case, the first dielectric layer may include a silicon-based dielectric material.

The first redistribution patterns may be provided in the first dielectric layer. The first redistribution pattern may include a first lower signal redistribution pattern 135S1, first lower power/ground redistribution patterns 135PG1, and a second lower power/ground redistribution pattern 135PG2.

The first lower signal redistribution pattern 135S1 may be disposed horizontally spaced apart and electrically insulated from the first and second lower power/ground redistribution patterns 135PG1 and 135PG2. The first lower signal redistribution pattern 135S1, the first lower power/ground redistribution patterns 135PG1, and the second lower power/ground redistribution patterns 135PG2 may include metal, such as one or more of copper, tungsten, titanium, and an alloy thereof.

The first lower signal pad 150S1, the second lower signal pad 150S2, and the first power/ground pads 150PG may be provided on a top surface of the first semiconductor chip 100. For example, the first lower signal pad 150S1, the second lower signal pad 150S2, and the first power/ground pads 150PG may be provided on a top surface of the first redistribution layer 120. The top surface of the first semiconductor chip 100 may include the top surface of the first redistribution layer 120. In example embodiments, the first redistribution layer 120 may surround at least a portion of each of the first lower signal pad 150S1, the second lower signal pad 150S2, and the first power/ground pads 150PG. For example, the first lower signal pad 150S1, the second lower signal pad 150S2, and the first power/ground pads 150PG may be considered to be at least partially embedded (e.g., buried) in the first redistribution layer 120. In example embodiments, top surfaces of the first lower signal pad 150S1, the second lower signal pad 150S2, and the first power/ground pads 150PG may be coplanar with the top surface of the first semiconductor chip 100. When viewed in plan, the first lower signal pad 150S1, the second lower signal pad 150S2, and the first power/ground pads 150PG may be provided adjacent to the third lateral surface of the first semiconductor chip 100. When viewed in plan, the first lower signal pad 150S1, the second lower signal pad 150S2, and the first power/ground pads 150PG may be aligned along the second direction D2.

The first lower signal pad 150S1 may be provided between the second lower signal pad 150S2 and the first lateral surface 101 of the first semiconductor chip 100. For example, the first lower signal pad 150S1 and the second lower signal pad 150S2 may each be a DQ signal pad. The first lower signal pad 150S1 and the second lower signal pad 150S2 may transmit data signals at relatively high speed. Alternatively, the first lower signal pad 150S1 and the second lower signal pad 150S2 may be used as transmission paths for signals other than DQ signals.

Each of the first power/ground pads 150PG may serve as a path for transmitting a voltage of the first semiconductor chip 100. The voltage may be a power voltage or a ground voltage. A voltage applied to one of the first power/ground pads 150PG may be the same as or different from that applied to another of the first power/ground pads 150PG. At least one of the first power/ground pads 150PG may be provided between the first lower signal pad 150S1 and the second lower signal pad 150S2. The at least one first power/ground pad 150PG may shield the occurrence of noise between the first lower signal pad 150S1 and the second lower signal pad 150S2. The noise may be crosstalk.

When viewed in plan, the first lower signal pad 150S1 may be provided between the first power/ground pads 150PG. For example, another of the first power/ground pad 150PG may be provided between the first lower signal pad 150S1 and the first lateral surface 101 of the first semiconductor chip 100. Therefore, it may be possible to further prevent crosstalk of the first lower signal pad 150S1.

The second lower signal pad 150S2 may be provided between the first power/ground pads 150PG. For example, a different one of the first power/ground pads 150PG may be provided between the second lower signal pad 150S2 and the second lateral surface 102 of the second semiconductor chip 200. Therefore, it may be possible to further prevent crosstalk of the second lower signal pad 150S2.

The first lower signal pad 150S1 and the second lower signal pad 150S2 may be coupled to the first lower signal redistribution pattern 135S1. Each of the first and second lower signal pads 150S1 and 150S2 may be coupled through the first lower signal redistribution pattern 135S1 to the first signal metal pad 115S. The first lower signal pad 150S1 may be electrically connected through the first lower signal redistribution pattern 135S1 to the second lower signal pad 150S2.

The first power/ground pads 150PG may be electrically connected through the first lower power/ground redistribution patterns 135G1 to the first power/ground metal pads 115PG. The first power/ground pads 150PG may include a first sub-power/ground pad and a second sub-power/ground pad. The first sub-power/ground pad may be in direct contact with one of the first lower power/ground redistribution patterns 135PG1. The second sub-power/ground pad may not be in direct contact with the first lower power/ground redistribution patterns 135PG1. The second lower power/ground redistribution pattern 135PG2 may be electrically connected to the first sub-power/ground pad and the second sub-power/ground pad. The second sub-power/ground pad may be electrically connected through the first lower power/ground redistribution pattern 135PG1 to the first sub-power/ground pad. A same voltage may be applied to the first sub-power/ground pad and the second sub-power/ground pad.

The first bonding wires WB1 may be provided on the top surface of the first semiconductor chip 100. The first bonding wires WB1 may include a first signal bonding wire sWB1 and first power/ground bonding wires pgWB1. The first power/ground bonding wires pgWB1 may be correspondingly provided on the first power/ground pads 150PG. The first power/ground bonding wires pgWB1 may be correspondingly coupled to the first power/ground pad 150PG and the power/ground substrate pads 550PG.

For example, the first power/ground bonding wires pgWB1 may be in direct with the first power/ground pads 150PG. For example, a voltage may be transmitted through the first power/ground bonding wires pgWB1 to the first power/ground pads 150PG. The voltage may be a power voltage or a ground voltage.

The first signal bonding wire sWB1 may be provided on the first lower signal pad 150S1. The first signal bonding wire sWB1 may be coupled to the first lower signal pad 150S1 and the signal substrate pad 550S. Therefore, the first semiconductor chip 100 may be electrically connected through the first signal bonding wire sWB1 to the substrate 500. The first signal bonding wire sWB1 may not be provided on the second lower signal pad 150S2. For example, the first signal bonding wire sWB1 may be spaced apart from and may not be in direct contact with the second lower signal pad 150S2. The second lower signal pad 150S2 may be electrically connected through the first lower signal redistribution pattern 135S1 to either the first lower signal pad 150S1 or the first signal bonding wire sWB1.

When a plurality of bonding wires for signal transmission are disposed adjacent to each other, crosstalk may occur between the bonding wires for signal transmission. According to some embodiments, any of the first bonding wires WB1 may not be provided on a top surface of the second lower signal pad 150S2. Therefore, there may be no signal bonding wire that is horizontally adjacent to the first signal bonding wire sWB1. It may be possible to prevent crosstalk of the first signal bonding wire sWB1.

According to some embodiments, the first signal bonding wire sWB1 may be provided between the first power/ground bonding wires pgWB1. For example, no signal bonding wire may be provided between the first signal bonding wire sWB1 and the first power/ground bonding wires pgWB1. The first power/ground bonding wires pgWB1 may further prevent crosstalk of the first signal bonding wire sWB1. The semiconductor package may increase in electrical properties and operating reliability.

When viewed in plan, each of the first bonding wires WB1 may be substantially parallel to the first direction D1. The first bonding wires WB1 may be spaced apart from each other in the second direction D2. Therefore, an electrical short may be prevented between the first bonding wires WB1. A uniform interval may be provided between two neighboring first bonding wires WB1. For example, a relatively small maximum interval may be provided between two neighboring first bonding wires WB1, and a relatively small minimum interval may be provided between the two neighboring first bonding wires WB1. Alternatively, the maximum interval and the minimum interval may be substantially the same. Therefore, the first bonding wires WB1 may be prevented from electrical interference and physical contact therebetween.

The second semiconductor chip 200 may be disposed on the top surface of the first semiconductor chip 100. As illustrated in FIG. 1C, the second semiconductor chip 200 may have a first sidewall 201, a second sidewall 202, and a third sidewall. The second sidewall 202 of the second semiconductor chip 200 may face the first sidewall 201 of the second semiconductor chip 200. The first and second sidewalls 201 and 202 of the second semiconductor chip 200 may be parallel to the first direction D1. The third sidewall of the second semiconductor chip 200 may neighbor the first and second sidewalls 201 and 202 of the second semiconductor chip 200. For example, the third sidewall may extend between the first and second sidewalls 201 and 202, and may connect the first and second sidewalls 201 and 202. The third sidewall of the second semiconductor chip 200 may be parallel to the second direction D2. The first sidewall 201, the second sidewall 202, and the third sidewall may also be referred to as a first lateral surface 201, a second lateral surface 202, and a third lateral surface, respectively.

The second semiconductor chip 200 may be vertically aligned with the first semiconductor chip 100. For example, the first sidewall 201, the second sidewall 202, and the third sidewall of the second semiconductor chip 200 may be vertically and respectively aligned with the first lateral surface 101, the second lateral surface 102, and the third lateral surface of the first semiconductor chip 100. In this description, the term "vertically" may indicate the meaning of "parallel to the third direction D3."

The second semiconductor chip 200 may include a second semiconductor substrate 210, a second redistribution layer 220, a first upper signal pad 250S1, second upper signal pads 250S2, and second power/ground pads 250PG. The second semiconductor chip 200 may further include second integrated circuits, a second wiring layer, and second metal pads. The second semiconductor substrate 210 may include silicon or silicon-germanium. The second integrated circuits may be provided on the second semiconductor substrate 210. The second wiring layer may be provided on the second semiconductor substrate 210 and may be coupled to the second integrated circuits. The second wiring layer may include at least one selected from a front-end-of-line layer and a back-end-of-line layer. The second metal pads may be provided on a top surface of the second wiring layer. The second metal pads may include a second signal metal pad 215S and second power/ground metal pads 215PG. The second signal metal pad 215S and the second power/ground metal pads 215PG may be center pads.

For example, when viewed in plan, the second signal metal pad 215S and the second power/ground metal pads 215PG may be provided on a central region of the second semiconductor chip 200. The second signal metal pad 215S and the second power/ground metal pads 215PG may be electrically connected to the second integrated circuits through second metal lines in the second wiring layer. The second signal metal pad 215S may be laterally spaced apart and electrically insulated from the second power/ground metal pads 215PG.

The second redistribution layer 220 may be provided on a top surface of the second semiconductor substrate 210. For example, the second wiring layer may be provided between the second semiconductor substrate 210 and the second redistribution layer 220. The second redistribution layer 220 may include a second dielectric layer and second redistribution patterns. The second dielectric layer may be a single layer or a multiple layer. The second dielectric layer may include a photo-imageable dielectric (PID) material or a dielectric polymer. Alternatively, the second redistribution layer 220 may be at least a portion of the back-end-of-line layer. In this case, the second dielectric layer may include a silicon-based dielectric material.

The second redistribution patterns may be provided in the second dielectric layer. The second redistribution patterns may include a first upper signal redistribution pattern 235S1, first upper power/ground redistribution patterns 235PG1, and a second upper power/ground redistribution pattern 235PG2. The first upper signal redistribution pattern 235S1 may be disposed laterally spaced apart and insulated from the first and second upper power/ground redistribution patterns 235PG1 and 235PG2. The first upper signal redistribution pattern 235S1, the first upper power/ground redistribution patterns 235PG1, and the second upper power/ground redistribution patterns 235PG2 may include metal, such as one or more of copper, tungsten, titanium, and an alloy thereof.

The first upper signal pad 250S1, the second upper signal pad 250S2, and the second power/ground pads 250PG may be provided on a top surface of the second semiconductor chip 200. For example, the first upper signal pad 250S1, the second upper signal pad 250S2, and the second power/ground pads 250PG may be provided on a top surface of the second redistribution layer 220. The top surface of the second semiconductor chip 200 may include the top surface of the second redistribution layer 220. In example embodiments, the second redistribution layer 220 may surround at least a portion of each of the first upper signal pad 250S1, the second upper signal pad 250S2, and the second power/ground pads 250PG. For example, the first upper signal pad 250S1, the second upper signal pad 250S2, and the second power/ground pads 250PG may be considered to be at least partially embedded (e.g., buried) in the second redistribution layer 220. In example embodiments, top surfaces of the first upper signal pad 250S1, the second upper signal pad 250S2, and the second power/ground pads 250PG may be coplanar with the top surface of the second semiconductor chip 200.

When viewed in plan, the first upper signal pad 250S1, the second upper signal pad 250S2, and the second power/ground pads 250PG may be provided adjacent to the third sidewall of the second semiconductor chip 200. When viewed in plan, the first upper signal pad 250S1, the second upper signal pad 250S2, and the second power/ground pads 250PG may be aligned along the second direction D2. The first upper signal pad 250S1 may be provided between the second upper signal pad 250S2 and the first sidewall 201 of the second semiconductor chip 200.

For example, the first upper signal pad 250S1 and the second upper signal pad 250S2 may each be a DQ signal pad. For example, it may be required that the first upper signal pad 250S1 and the second upper signal pad 250S2 should transmit data signal at relatively high speed. Alternatively, the first upper signal pad 250S1 and the second upper signal pad 250S2 may be used as transmission paths for signals other than DQ signals.

Each of the second power/ground pads 250PG may serve as a path for transmitting a voltage of the second semiconductor chip 200. The voltage may be a power voltage or a ground voltage. A voltage applied to one of the second power/ground pads 250PG may be the same as or different from that applied to another of the second power/ground pads 250PG. At least one of the second power/ground pads 250PG may be provided between the first upper signal pad 250S1 and the second upper signal pad 250S2. The at least one second power/ground pad 250PG may prevent crosstalk interference between the first upper signal pad 250S1 and the second upper signal pad 250S2.

When viewed in plan, the first upper signal pad 250S1 may be provided between the second power/ground pads 250PG. For example, another of the second power/ground pads 250PG may be provided between the first upper signal pad 250S1 and the first sidewall 201 of the second semiconductor chip 200. Therefore, it may be possible to further prevent crosstalk of the first upper signal pad 250S1.

The second upper signal pad 250S2 may be provided between the second power/ground pads 250PG. For example, a different one of the second power/ground pads 250PG may be provided between the second upper signal pad 250S2 and the second sidewall 202 of the second semiconductor chip 200. Therefore, it may be possible to further prevent crosstalk of the second upper signal pad 250S2.

The first upper signal redistribution pattern 235S1 may be coupled to the first upper signal pad 250S1 and the second upper signal pad 250S2. The first upper signal pad 250S1 and the second upper signal pad 250S2 may be electrically connected to each other through the first upper signal redistribution pattern 235S1. Each of the first and second upper signal pads 250S1 and 250S2 may be coupled through the first upper signal redistribution pattern 235S1 to the first signal metal pad 115S.

The second power/ground pads 250PG may be electrically connected through the first upper power/ground redistribution patterns 235PG1 to the second power/ground metal pads 215PG. The second power/ground pads 250PG may include a third sub-power/ground pad and a fourth sub-power/ground pad. The third sub-power/ground pad may be in contact with one of the first upper power/ground redistribution patterns 235PG1. The third sub-power/ground pad may not be in direct contact with the first upper power/ground redistribution patterns 235PG1. The second upper power/ground redistribution pattern 235PG2 may be electrically connected to the third sub-power/ground pad and the fourth sub-power/ground pad. The fourth sub-power/ground pad may be electrically connected through the second upper power/ground redistribution pattern 235PG2 to the third sub-power/ground pad. A same voltage may be applied to the third sub-power/ground pad and the fourth sub-power/ground pad.

The second semiconductor chip 200 may be of the same type as the first semiconductor chip 100. The second semiconductor chip 200 may have the same size and storage capacity as those of the first semiconductor chip 100. The second semiconductor chip 200 may include a memory chip, such as DRAM and NAND. The second semiconductor chip 200 may have components substantially the same as those of the first semiconductor chip 100.

When viewed in plan as illustrated in FIG. 1A, the first upper signal pad 250S1, the second upper signal pad 250S2, and the second power/ground pads 250PG may respectively overlap the first lower signal pad 150S1, the second lower signal pad 150S2, and the first power/ground pads 150PG. The first upper signal pad 250S1, the second upper signal pad 250S2, and the second power/ground pads 250PG may have shapes and arrangements substantially the same as those of the first lower signal pad 150S1, the second lower signal pad 150S2, and the first power/ground pads 150PG, respectively. The first upper signal pad 250S1, the second upper signal pad 250S2, and the second power/ground pads 250PG may have functions and electrical connections substantially the same as those of the first lower signal pad 150S1, the second lower signal pad 150S2, and the first power/ground pads 150PG, respectively.

The first upper signal redistribution pattern 235S1, the first upper power/ground redistribution patterns 235PG1, and the second upper power/ground redistribution patterns 235PG2 may have shapes and arrangements substantially the same as those of the first lower signal redistribution pattern 135S1, the first lower power/ground redistribution patterns 135PG1, and the second lower power/ground redistribution pattern 135PG2, respectively. For example, when viewed in plan, the first upper signal redistribution pattern 235S1, the first upper power/ground redistribution patterns 235PG1, and the second upper power/ground redistribution patterns 235PG2 may respectively overlap the first lower signal redistribution pattern 135S1, the first lower power/ground redistribution patterns 135PG1, and the second lower power/ground redistribution pattern 135PG2. The first upper signal redistribution pattern 235S1, the first upper power/ground redistribution patterns 235PG1, and the second upper power/ground redistribution patterns 235PG2 may have functions and electrical connections the same as those of the first lower signal redistribution pattern 135S1, the first lower power/ground redistribution patterns 135PG1, and the second lower power/ground redistribution pattern 135PG2, respectively.

The second signal metal pad 215S and the second power/ground metal pads 215PG may have shapes and arrangements substantially the same as those of the first signal metal pad 115S and the first power/ground metal pads 115PG, respectively. For example, when viewed in plan, the second signal metal pad 215S and the second power/ground metal pads 215PG may respectively overlap the first signal metal pad 115S and the first power/ground metal pads 115PG. The second signal metal pad 215S and the second power/ground metal pads 215PG may have roles substantially the same as those of the first signal metal pad 115S and the first power/ground metal pads 115PG, respectively.

For another example, the second semiconductor chip 200 may be a logic chip or a buffer chip.

The second bonding wires WB2 may be provided on the top surface of the second semiconductor chip 200. The second bonding wires WB2 may include a second signal bonding wire sWB2 and second power/ground bonding wires pgWB2. The second power/ground bonding wires pgWB2 may be correspondingly provided on the second power/ground pads 250PG. The second power/ground bonding wires pgWB2 may be correspondingly coupled to the second power/ground pad 250PG and the power/ground substrate pads 550PG. Therefore, a voltage may be transmitted through the second power/ground bonding wires pgWB2 to the second power/ground pads 250PG. The voltage may be a power voltage or a ground voltage. The second power/ground bonding wires pgWB2 and the first power/ground bonding wires pgWB1 may share the power/ground substrate pads 550PG. For example, one of the power/ground substrate pads 550PG may be coupled to one of the second power/ground bonding wires pgWB2 and to one of the first power/ground bonding wires pgWB1.

The second signal bonding wire sWB2 may be provided on the second upper signal pad 250S2. The second signal bonding wire sWB2 may be coupled to the second upper signal pad 250S2 and the signal substrate pad 550S. The second semiconductor chip 200 may be electrically connected through the second signal bonding wire sWB2 to the substrate 500. When viewed in plan, the second signal bonding wire sWB2 may overlap the second lower signal pad 150S2. The second signal bonding wire sWB2 may be vertically spaced apart from the second lower signal pad 150S2. Because the first signal bonding wire sWB1 is not provided on the second lower signal pad 150S2, as illustrated in FIG. 1E, the second signal bonding wire sWB2 may not vertically overlap the first signal bonding wire sWB1. For example, the first bonding wires WB1 may not be provided between the second signal bonding wire sWB2 and the second lower signal pad 150S2. Therefore, the occurrence of crosstalk may be prevented between the first signal bonding wire sWB1 and the second signal bonding wire sWB2.

Any of the second bonding wires WB2 may not be provided on the first upper signal pad 250S1. For example, the second signal bonding wire sWB2 may not be provided on the first upper signal pad 250S1. The second signal bonding wire sWB2 may be spaced apart from a top surface of the first upper signal pad 250S1 and may not be in direct contact with the first upper signal pad 250S1. Therefore, as illustrated in FIG. 1D, the first signal bonding wire sWB1 may not vertically overlap the second signal bonding wire sWB2. The first signal bonding wire sWB1 may vertically overlap none of the second bonding wires WB2. The occurrence of crosstalk may be further prevented between the first signal bonding wire sWB1 and the second signal bonding wire sWB2.

The first upper signal pad 250S1 may be electrically connected through the first upper signal redistribution pattern 235S1 to either the second lower signal pad 150S2 or the second signal bonding wire sWB2.

According to some embodiments, the second signal bonding wire sWB2 may be provided between the second power/ground bonding wires pgWB2. For example, no signal bonding wire may be provided between the second signal bonding wire sWB2 and the second power/ground bonding wires pgWB2. Therefore, it may be possible to further prevent crosstalk of the second signal bonding wire sWB2. The semiconductor package may increase in electrical properties and operating reliability.

When viewed in plan, each of the second bonding wires WB2 may be substantially parallel to the first direction D1. Therefore, an electrical short may be prevented between the second bonding wires WB2. A uniform interval may be provided between two neighboring second bonding wires WB2. For example, a relatively small maximum interval may be provided between two neighboring second bonding wires WB2, and a relatively small minimum interval may be provided between the two neighboring second bonding wires WB2. Alternatively, the maximum interval and the minimum interval may be substantially the same as each other. Therefore, the second bonding wires WB2 may be prevented from electrical interference and physical contact therebetween.

The semiconductor package may further include a molding layer 700. The molding layer 700 may be provided on the top surface of the substrate 500, covering the first semiconductor chip 100 and the second semiconductor chip 200. The molding layer 700 may encapsulate the first and second bonding wires WB1 and WB2. The molding layer 700 may have outer sidewalls vertically aligned with sidewalls of the substrate 500. The molding layer 700 may include a dielectric polymer, such as an epoxy-based molding compound.

The semiconductor package may further include adhesive layers 710. The adhesive layers 710 may be provided on a bottom surface of the first semiconductor chip 100 and a bottom surface of the second semiconductor chip 200. The adhesive layers 710 may be die attach films. The adhesive layers 710 may include, for example, a dielectric polymer. The adhesive layers 710 may include a different material from that of the molding layer 700. The first bonding wires WB1 may have their ends covered with the adhesive layer 710.

For brevity in figures other than FIGS. 1A to 1E, 2B, 2C, and 6A, there is omission of illustration of one or more of the first signal metal pad 115S, the first power/ground metal pad 115PG, the second signal metal pad 215S, the second power/ground metal pad 215PG, the first lower signal redistribution pattern 135S1, the first lower power/ground redistribution pattern 135PG1, the second lower power/ground redistribution pattern 135PG2, the first upper signal redistribution pattern 235S1, the first upper power/ground redistribution pattern 235PG1, and the second upper power/ground redistribution pattern 235PG2.

Figure 2A:
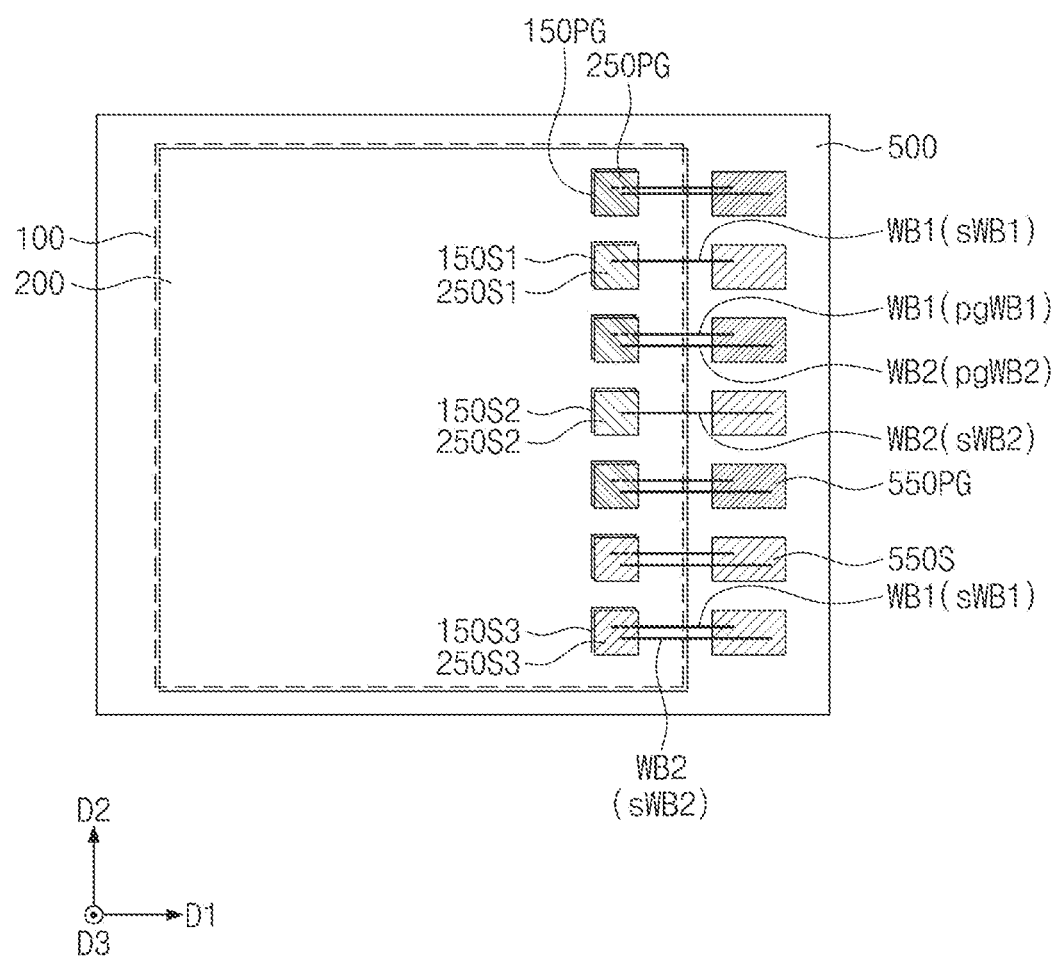
FIG. 2A illustrates a plan view showing a semiconductor package, according to example embodiments.
Figure 2B:
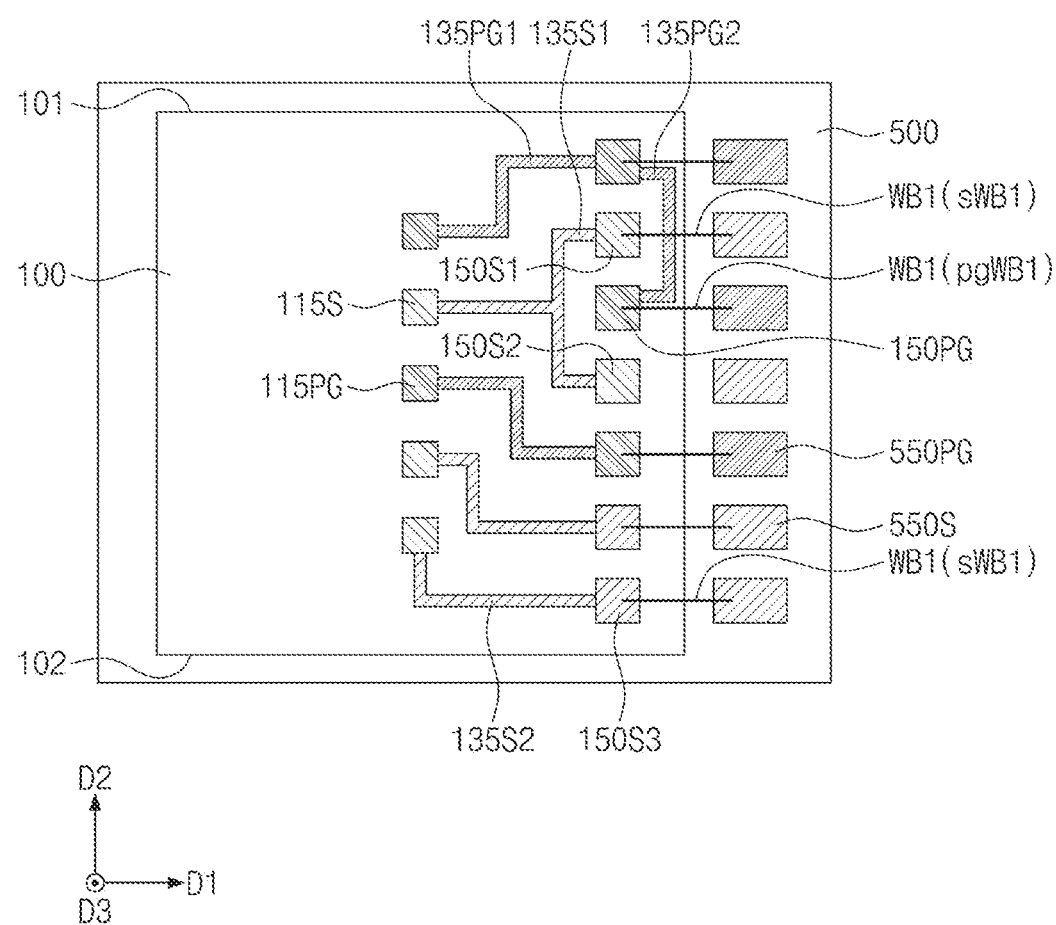
FIG. 2B illustrates a plan view showing an arrangement of a substrate, a first semiconductor chip, and a first bonding wire, according to example embodiments.
Figure 2C:
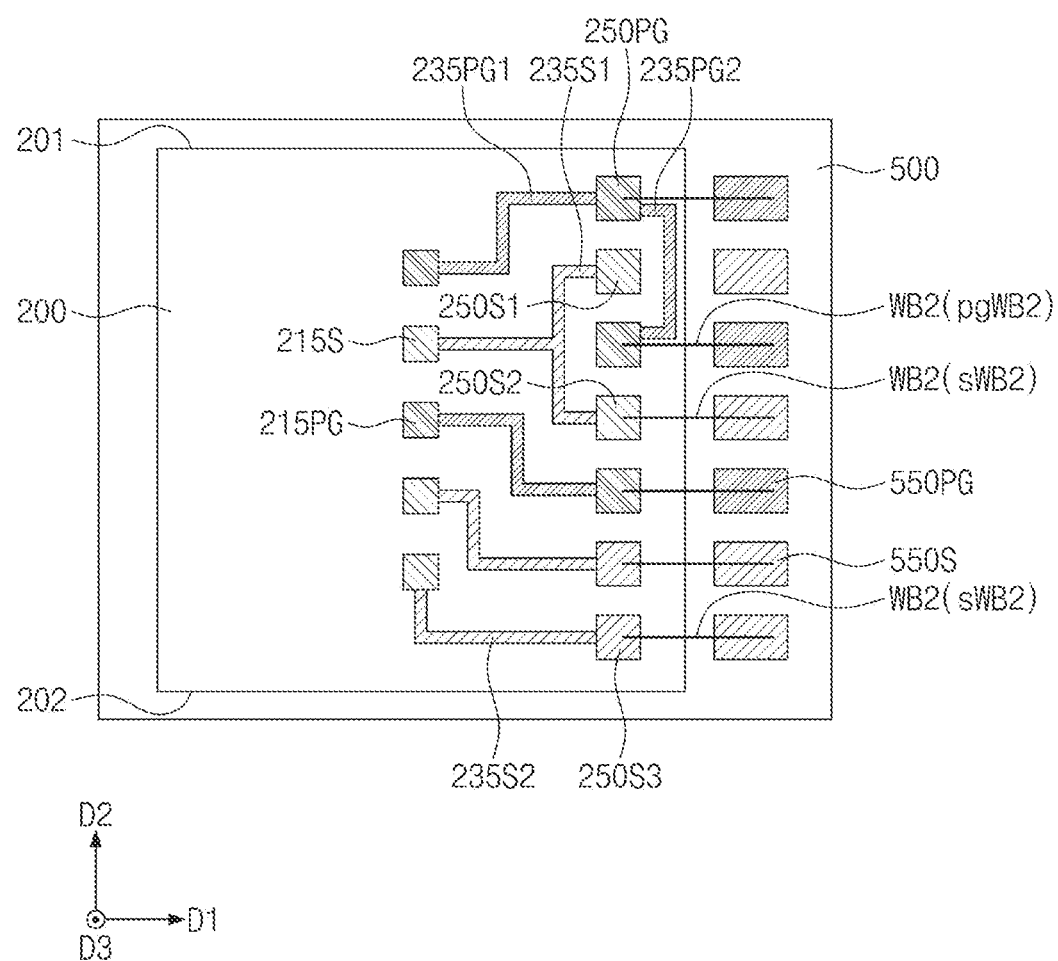
FIG. 2C illustrates a plan view showing an arrangement of a substrate, a second semiconductor chip, and a second bonding wire, according to example embodiments.

FIG. 2A illustrates a plan view showing a semiconductor package according to example embodiments. FIG. 2B illustrates a plan view showing an arrangement of a substrate, a first semiconductor chip, and a first bonding wire according to example embodiments. FIG. 2C illustrates a plan view showing an arrangement of a substrate, a second semiconductor chip, and a second bonding wire according to example embodiments. The following description of FIGS. 2A to 2C will refer to FIGS. 1D to 1F.

Referring to FIGS. 2A to 2C, a semiconductor package may include a substrate 500, a first semiconductor chip 100, a second semiconductor chip 200, first bonding wires WB1, and second bonding wires WB2. The substrate 500, the first semiconductor chip 100, the second semiconductor chip 200, the first bonding wires WB1, and the second bonding wires WB2 may be substantially the same as those discussed above in the examples of FIGS. 1A to 1F. The semiconductor package may further include solder balls 600, adhesive layers 710, and a molding layer 700 that are discussed in connection with the examples of FIGS. 1D to 1F.

As illustrated in FIG. 2B, the first semiconductor chip 100 may include a plurality of first signal metal pads 115S, the first power/ground metal pads 115PG, a first lower signal redistribution pattern 135S1, first and second lower power/ground redistribution patterns 135PG1 and 135PG2, a first lower signal pad 150S1, a second lower signal pad 150S2, and first power/ground pads 150PG, and may further include a second lower signal redistribution pattern 135S2 and a third lower signal pad 150S3. The first lower signal pad 150S1 may be coupled through the first lower signal redistribution pattern 135S1 to one of the first signal metal pads 115S.

The second lower signal redistribution pattern 135S2 may be provided in a first redistribution layer 120 discussed in connection with the examples of FIGS. 1D to 1F. The second lower signal redistribution pattern 135S2 may be laterally spaced apart and electrically separated from the first lower signal redistribution pattern 135S1 and the first and second lower power/ground redistribution patterns 135PG1 and 135PG2. The second lower signal redistribution pattern 135S2 may include a metallic material discussed in the example of the first lower signal redistribution pattern 135S1. The second lower signal redistribution pattern 135S2 may be electrically connected to another of the first signal metal pads 115S.

The third lower signal pad 150S3 may be disposed on a top surface of the first semiconductor chip 100. For example, the third lower signal pad 150S3 may be provided on a top surface of the first redistribution layer 120 discussed in connection with the examples of FIGS. 1D to 1F. The third lower signal pad 150S3 may include the same metal as that of the first and second lower signal pads 150S1 and 150S2. The third lower signal pads 150S3 may be disposed spaced apart and electrically insulated from the first and second lower signal pads 150S1 and 150S2 and the first power/ground pads 150PG. The third lower signal pad 150S3 may be coupled through the second lower signal redistribution pattern 135S2 to the another first signal metal pad 115S.

The third lower signal pad 150S3 may transmit an electrical signal different from that of the first lower signal pad 150S1 and that of the second lower signal pad 150S2. For example, a signal transmission speed required for the third lower signal pad 150S3 may be less than that required for the first lower signal pad 150S1 or that required for the second lower signal pad 150S2. For examples, the signal transmission speeds of the first and second lower signal pads 150S1 and 150S2 may be greater than that of the third lower signal pad 150S3. The first and second lower signal pads 150S1 and 150S2 may transfer DQ signals, and the third lower signal pad 150S3 may transfer an electrical signal other than the DQ signal.

A corresponding one of the first signal bonding wires sWB1 may be coupled to the third lower signal pad 150S3. The first semiconductor chip 100 may include a plurality of third lower signal pads 150S3, but the present inventive concepts are not limited thereto.

As illustrated in FIG. 2C, the second semiconductor chip 200 may include a plurality of second signal metal pads 215S, the second power/ground metal pads 215PG, a first upper signal redistribution pattern 235S1, first and second upper power/ground redistribution patterns 235PG1 and 235PG2, a first upper signal pad 250S1, a second upper signal pad 250S2, and second power/ground pads 250PG, and may further include a second upper signal redistribution pattern 235S2 and a third upper signal pad 250S3. The first upper signal pad 250S1 may be coupled through the first upper signal redistribution pattern 235S1 to one of the second signal metal pads 215S.

The second upper signal redistribution pattern 235S2 may be provided in a second redistribution layer 220 discussed in connection with the examples of FIGS. 1D to 1F. The second upper signal redistribution pattern 235S2 may include the same material as that of the first upper signal redistribution pattern 235S1. The second upper signal redistribution pattern 235S2 may have a shape and arrangement substantially the same as that of the second lower signal redistribution pattern 135S2 depicted in FIG. 2B. For example, the second semiconductor chip 200 may be provided on the first semiconductor chip 100 so as to allow the second upper signal redistribution pattern 235S2 to overlap the second lower signal redistribution pattern 135S2 when viewed in plan. The second upper signal redistribution pattern 235S2 may be laterally spaced apart from the first upper signal redistribution pattern 235S1 and the first and second upper power/ground redistribution patterns 235PG1 and 235PG2. The second upper signal redistribution pattern 235S2 and the second lower signal redistribution pattern 135S2 may be identical or substantially the same as each other in terms of role and electrical connection. For example, the second upper signal redistribution pattern 235S2 may be electrically connected to another of the first signal metal pads 115S. The second upper signal redistribution pattern 235S2 may be electrically separated from the first upper signal redistribution pattern 235S1 and the first and second upper power/ground redistribution patterns 235PG1 and 235PG2.

The third upper signal pads 250S3 may be disposed on a top surface of the second semiconductor chip 200. For example, the third upper signal pads 250S3 may be provided on a top surface of the second redistribution layer 220 discussed in connection with the examples of FIGS. 1D to 1F.

The third upper signal pads 250S3 may have their arrangement and shapes substantially the same as that of the third lower signal pad 150S3. For example, when viewed in plan, the third upper signal pads 250S3 may overlap the third lower signal pad 150S3. The third upper signal pads 250S3 may be disposed spaced apart from the first and second upper signal pads 250S1 and 250S2 and the second power/ground pads 250PG. The third upper signal pads 250S3 and the third lower signal pad 150S3 may be identical or substantially the same as each other in terms of role and electrical connection. For example, the third upper signal pads 250S3 may be electrically connected to the first and second upper signal pads 250S1 and 250S2 and the second power/ground pads 250PG. The third upper signal pads 250S3 may be coupled through the second upper signal redistribution pattern 235S2 to the another second signal metal pad 215S.

The third upper signal pads 250S3 may transfer an electrical signal other than those that first and second upper signal pads 250S1 and 250S2 transfer. A signal transmission speed required for the third upper signal pads 250S3 may be less than those of the first and second upper signal pads 250S1 and 250S2. For example, the signal transmission speeds of the first and second upper signal pads 250S1 and 250S2 may be greater than that of the third upper signal pads 250S3. For example, the second upper signal pad 250S2 may transfer a DQ signal, and the third upper signal pads 250S3 may transfer an electrical signal other than the DQ signal.

A corresponding one of the second signal bonding wires sWB2 may be coupled to the third upper signal pad 250S3. The second semiconductor chip 200 may include a plurality of third upper signal pads 250S3, but the present inventive concepts are not limited thereto.

Figure 3:
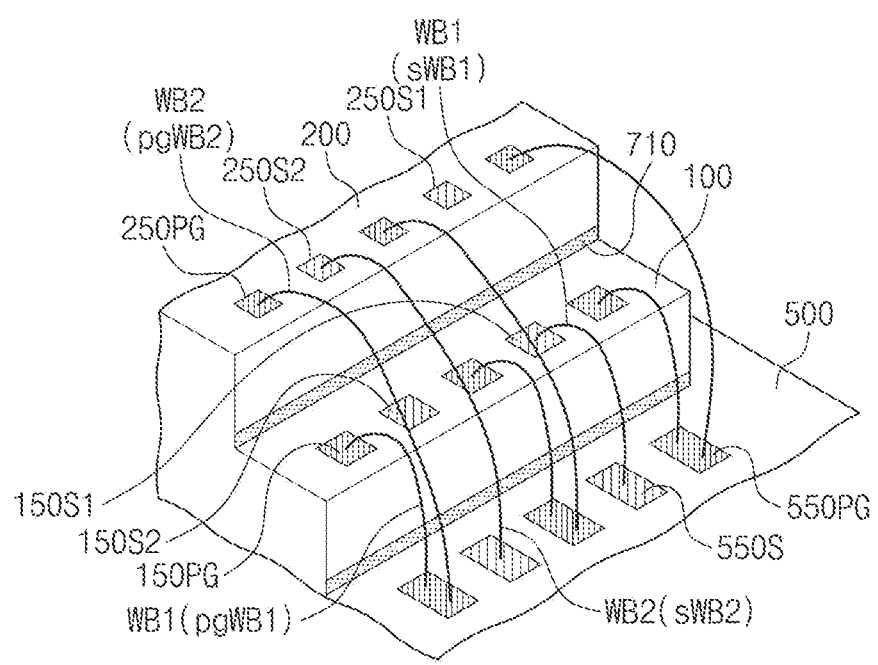
FIG. 3 illustrates a perspective view partially showing a semiconductor package, according to example embodiments.
Figure 4A:
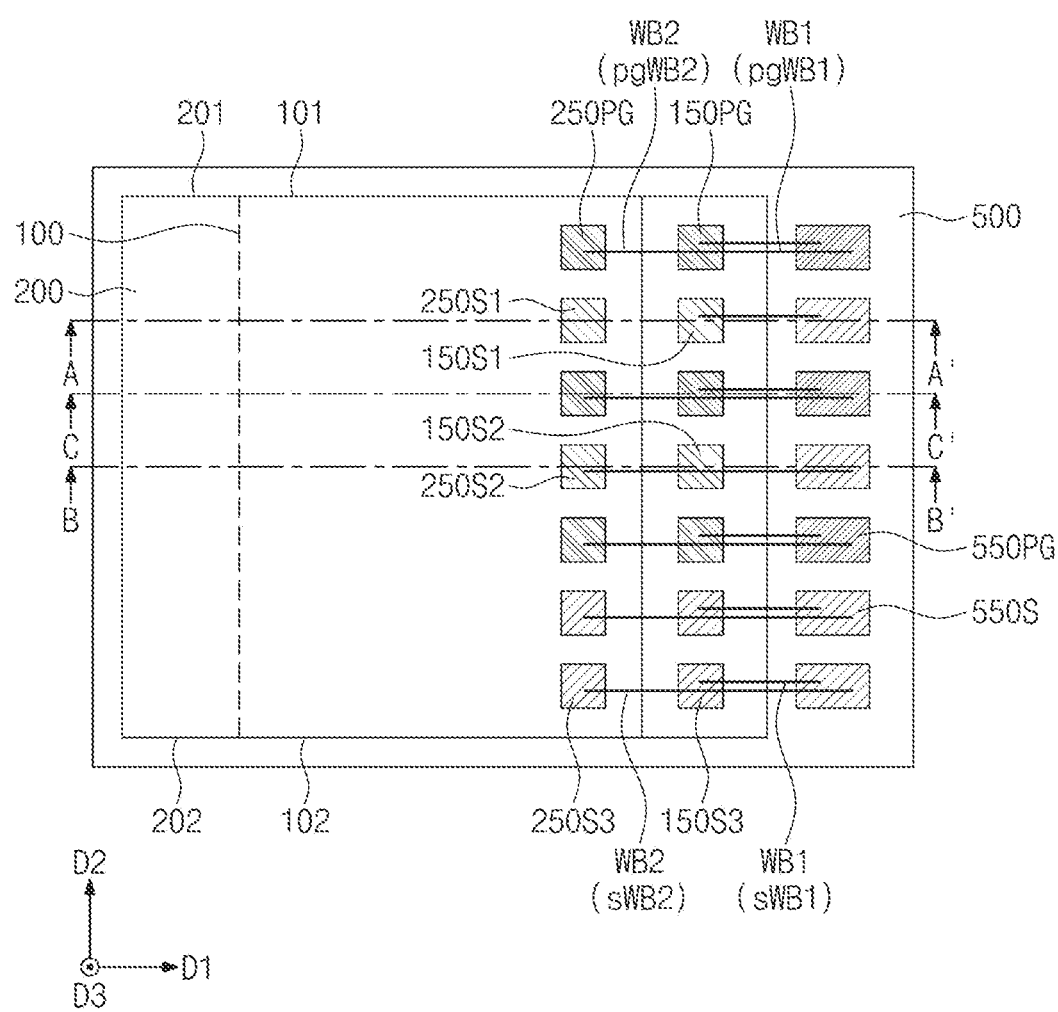
FIG. 4A illustrates a plan view showing a semiconductor package, according to example embodiments.
Figure 4B:
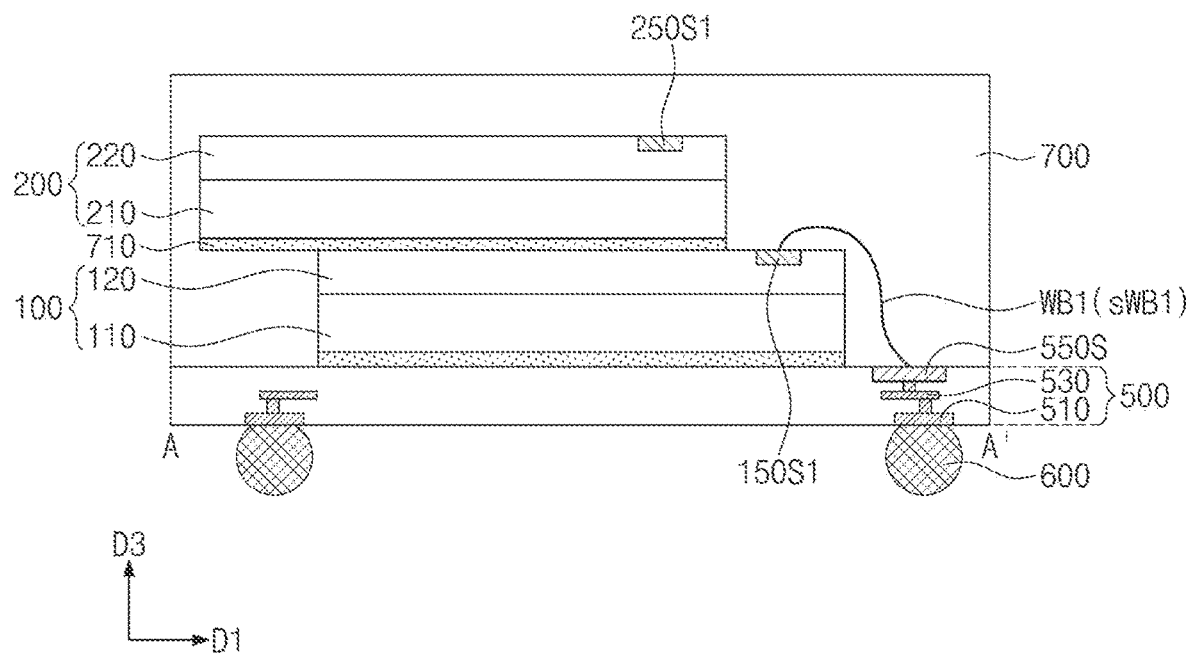
FIG. 4B illustrates a cross-sectional view taken along line A-A' of FIG. 4A.
Figure 4C:
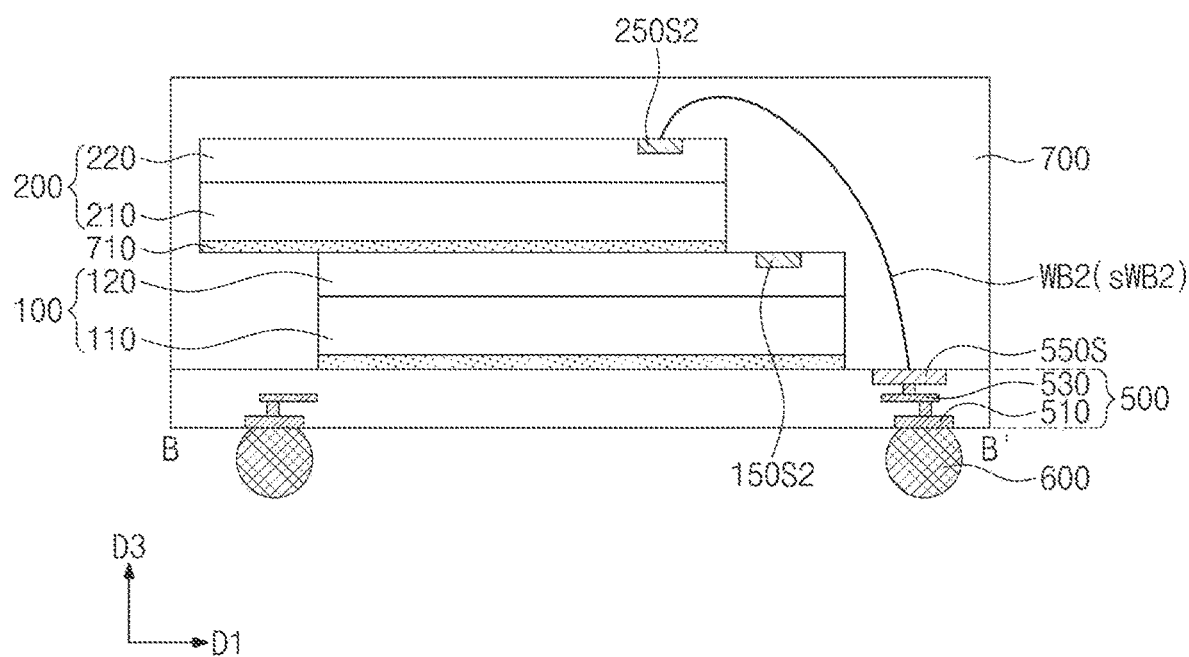
FIG. 4C illustrates a cross-sectional view taken along line B-B' of FIG. 4A.
Figure 4D:
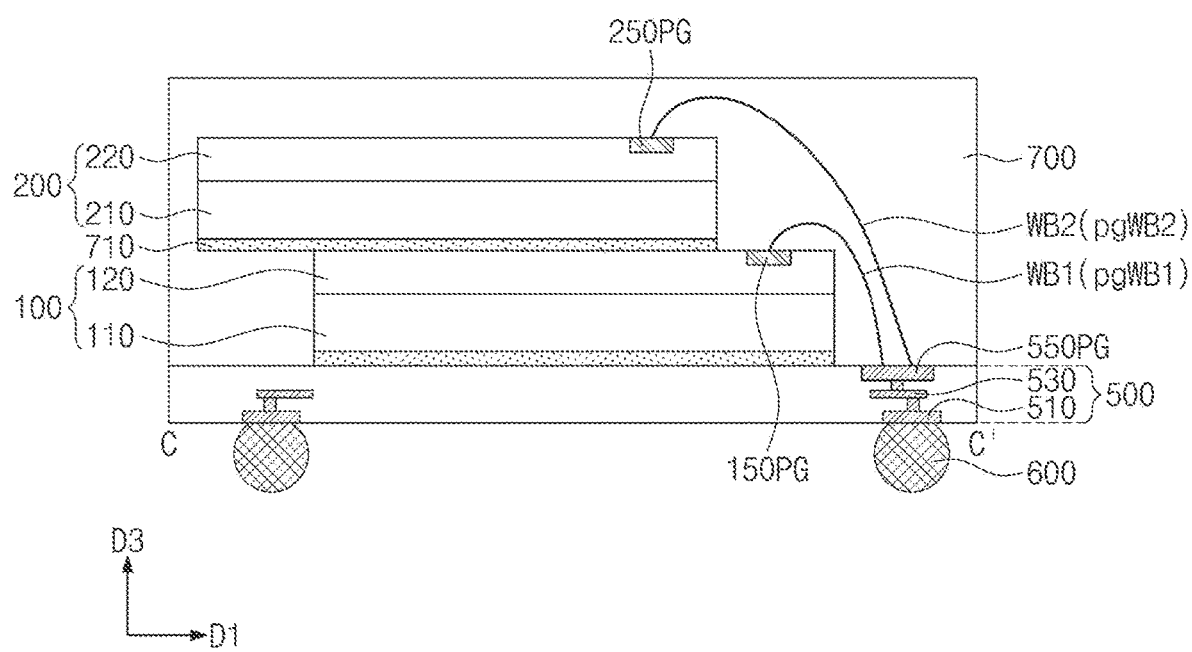
FIG. 4D illustrates a cross-sectional view taken along line C-C' of FIG. 4A.

FIG. 3 illustrates a perspective view partially showing a semiconductor package according to example embodiments. FIG. 4A illustrates a plan view showing a semiconductor package according to example embodiments. FIG. 4B illustrates a cross-sectional view taken along line A-A' of FIG. 4A. FIG. 4C illustrates a cross-sectional view taken along line B-B' of FIG. 4A. FIG. 4D illustrates a cross-sectional view taken along line C-C' of FIG. 4A. A duplicate description will be omitted below.

Referring to FIGS. 3, 4A, 4B, 4C, and 4D, a semiconductor package may include a substrate 500, a first semiconductor chip 100, a second semiconductor chip 200, first bonding wires WB1, and second bonding wires WB2. The semiconductor package may further include solder balls 600, adhesive layers 710, and a molding layer 700 that are discussed in connection with the examples of FIGS. 1D to 1F.

The second semiconductor chip 200 may be of the same type as the first semiconductor chip 100. The second semiconductor chip 200 may be provided on a top surface of the first semiconductor chip 100. The second semiconductor chip 200 may be disposed shifted from the first semiconductor chip 100 in a direction opposite to the first direction D1. The second semiconductor chip 200 may be spaced apart from and expose the first lower signal pad 150S1, the second lower signal pad 150S2, and the first power/ground pads 150PG. As illustrated in FIGS. 4B to 4D, the molding layer 700 may cover the first lower signal pad 150S1, the second lower signal pad 150S2, and the first power/ground pads 150PG.

A plurality of first signal bonding wires sWB1 may be in contact with the first lower signal pad 150S1 and the third lower signal pad 150S3. The first signal bonding wire sWB1 may not be provided on a top surface of the second lower signal pad 150S2 and may not be in direct contact with the second lower signal pad 150S2. The first power/ground bonding wires pgWB1 may be coupled to the first power/ground pads 150PG.

A plurality of second signal bonding wires sWB2 may be in contact with the second upper signal pad 250S2 and the third upper signal pads 250S3. The second signal bonding wire sWB2 may not be provided on a top surface of the first lower signal pad 150S1 and may not be in direct contact with the first upper signal pad 250S1. The second power/ground bonding wires pgWB2 may be coupled to the second power/ground pads 250PG.

When viewed in plan, the first lower signal pad 150S1 may be disposed between the first upper signal pad 250S1 and one of the signal substrate pads 550S. One of the signal substrate pads 550S may be coupled through a corresponding first signal bonding wire sWB1 to the first lower signal pad 150S1.

When viewed in plan, the second lower signal pad 150S2 may be disposed between the second upper signal pad 250S2 and another of the signal substrate pads 550S. The another of the signal substrate pads 550S may be coupled through a corresponding second signal bonding wire sWB2 to the second upper signal pad 250S2.

Figure 5A:
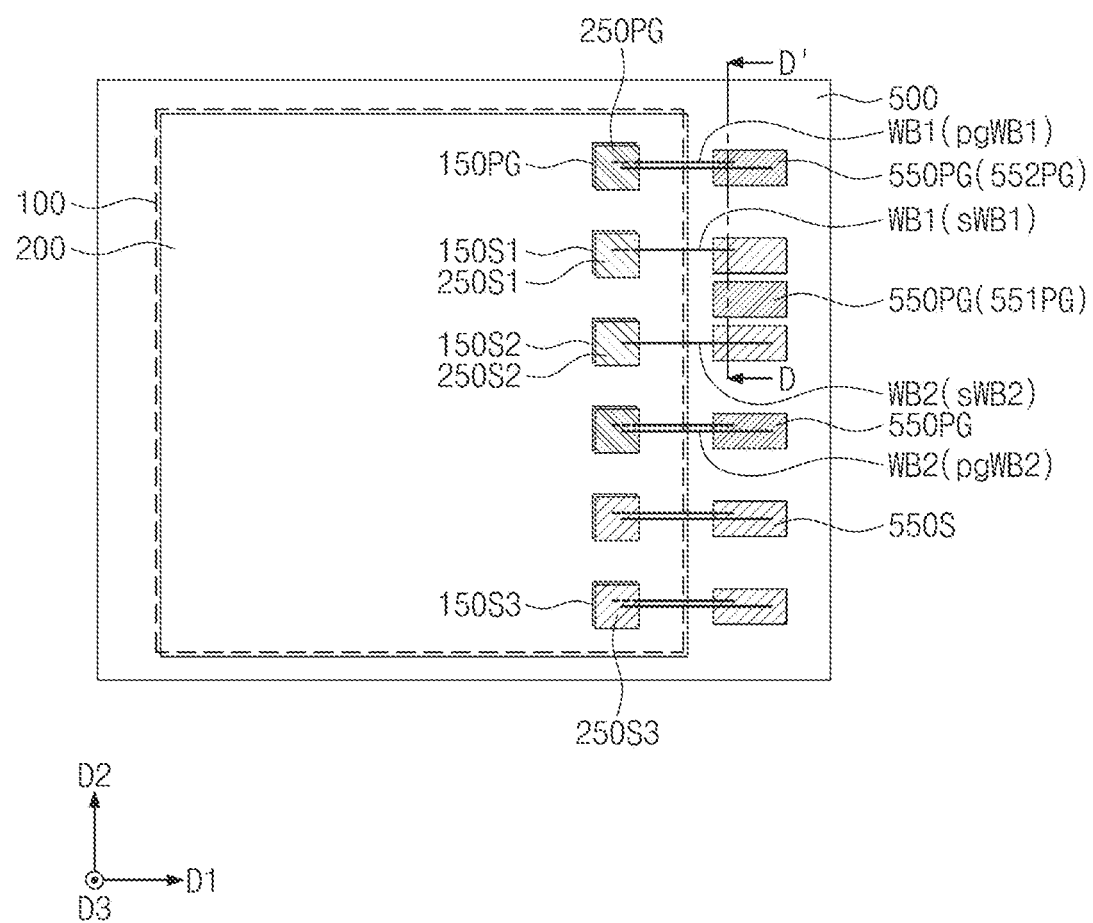
FIG. 5A illustrates a plan view showing a semiconductor package, according to example embodiments.
Figure 5B:
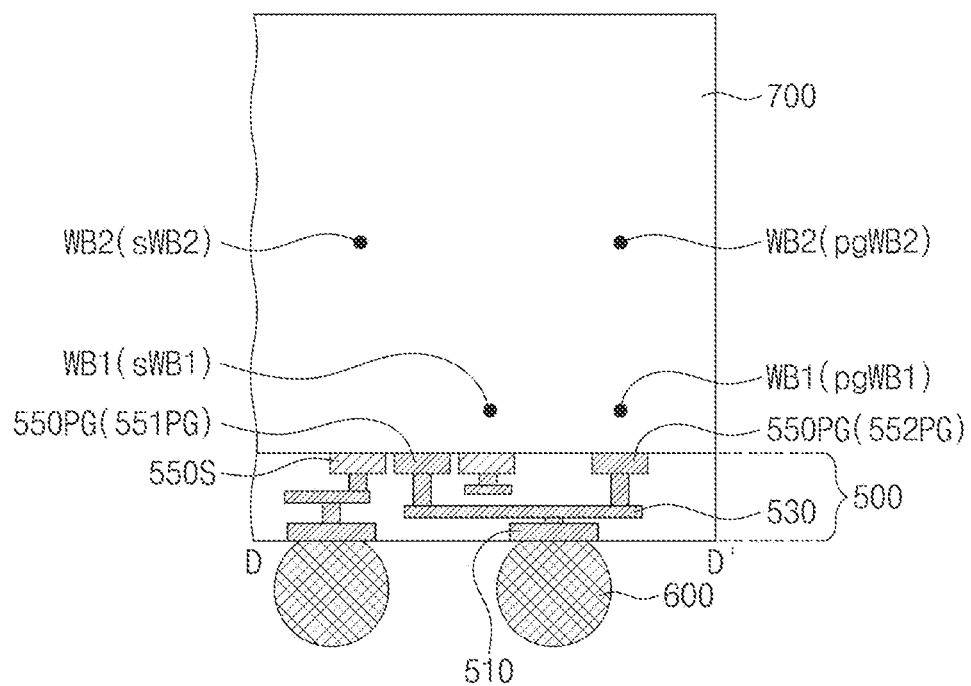
FIG. 5B illustrates a cross-sectional view taken along line D-D' of FIG. 5A.

FIG. 5A illustrates a plan view showing a semiconductor package according to example embodiments. FIG. 5B illustrates a cross-sectional view taken along line D-D' of FIG. 5A.

Referring to FIGS. 5A and 5B, a semiconductor package may include a substrate 500, a first semiconductor chip 100, a second semiconductor chip 200, first bonding wires WB1, and second bonding wires WB2. The semiconductor package may further include solder balls 600, adhesive layers 710 (not illustrated), and a molding layer 700 that are discussed in connection with the examples of FIGS. 1D to 1F. The substrate 500, the first semiconductor chip 100, the second semiconductor chip 200, and the first bonding wires WB1 may be substantially the same as those discussed above in connection with the examples of FIG. 1A to 1F or in connection with the examples of FIGS. 2A to 2C.

The first lower signal pad 150S1 and the second lower signal pad 150S2 may be adjacent to each other. Any of the first power/ground pads 150PG may not be provided between the first lower signal pad 150S1 and the second lower signal pad 150S2. The first semiconductor chip 100 may include no second lower power/ground redistribution pattern 135PG2 discussed in the examples of FIGS. 1A and 1B, but the present inventive concepts are not limited thereto.

The first upper signal pad 250S1 and the second upper signal pad 250S2 may be adjacent to each other. The second power/ground pads 250PG may not be provided between the first upper signal pad 250S1 and the second upper signal pad 250S2. The second semiconductor chip 200 may include no second upper power/ground redistribution pattern 235PG2 discussed in the examples of FIGS. 1A and 1B, but the present inventive concepts are not limited thereto.

The substrate 500 may include signal substrate pads 550S and power/ground substrate pads 550PG. The power/ground substrate pads 550PG may include a first power/ground substrate pad 551PG and a second power/ground substrate pad 552PG. The first power/ground substrate pad 551PG may be provided between the signal substrate pads 550S (e.g., first signal substrate pads). The first signal substrate pads of the signal substrate pads 550S may include a signal substrate pad 550S coupled to the first lower signal pad 150S1 and a signal substrate pad 550S coupled to the second upper signal pad 250S2. The first signal substrate pads of the signal substrate pads 550S may be adjacent to each other. The first signal substrate pads of the signal substrate pads 550S may transfer DQ signals.

The second power/ground substrate pad 552PG may be spaced apart from the first power/ground substrate pad 551PG. The second power/ground substrate pad 552PG may not be provided between the first signal substrate pads of the signal substrate pads 550S.

As illustrated in FIG. 5B, the first power/ground substrate pad 551PG and the second power/ground substrate pad 552PG may be electrically connected to each other through their corresponding substrate wiring line 530. The first power/ground substrate pad 551PG may be supplied through the substrate wiring line 530 with a power voltage or a ground voltage.

One of the first power/ground bonding wires pgWB1 and one of the second power/ground bonding wires pgWB2 may be coupled to the second power/ground substrate pad 552PG. Any of the first and second power/ground bonding wires pgWB1 and pgWB2 may not be provided on a top surface of the first power/ground substrate pad 551PG. According to some embodiments, the presence of the first power/ground substrate pad 551PG may prevent crosstalk of the first signal substrate pads among the signal substrate pads 550S. Accordingly, the semiconductor package may increase in electrical properties.

Each of the first and second bonding wires WB1 and WB2 may be substantially parallel to the first direction D1.

FIG. 5C illustrates a plan view showing a semiconductor package according to some embodiments. The description of FIG. 5C will refer to FIG. 5B. A duplicate description discussed above will be omitted below.

Referring to FIG. 5C, a semiconductor package may include a substrate 500, a first semiconductor chip 100, a second semiconductor chip 200, first bonding wires WB1, and second bonding wires WB2. Although not illustrated, the semiconductor package may further include solder balls 600, adhesive layers 710, and a molding layer 700 that are discussed in connection with the examples of FIGS. 1D to 1F.

The substrate 500, the first semiconductor chip 100, the second semiconductor chip 200, the first bonding wires WB1, and the second bonding wires WB2 may be substantially the same as those discussed in connection with the examples of FIGS. 5A and 5B. For example, as illustrated in FIG. 5B, the first power/ground substrate pad 551PG and the second power/ground substrate pad 552PG may be electrically connected to each other through their corresponding substrate wiring line 530.

In contrast, when viewed in plan, the first signal bonding wire sWB1 coupled to the first lower signal pad 150S may not be parallel to the first direction D1. For example, the first signal bonding wire sWB1 coupled to the first lower signal pad 150S1 may be at an angle with respect to the first direction D1. When viewed in plan, the second signal bonding wire sWB2 coupled to the first upper signal pad 250S1 may not be parallel to the first direction D1. For example, the second signal bonding wire sWB2 coupled to the first upper signal pad 250S1 may be at an angle with respect to the first direction D1.

Figure 6A:
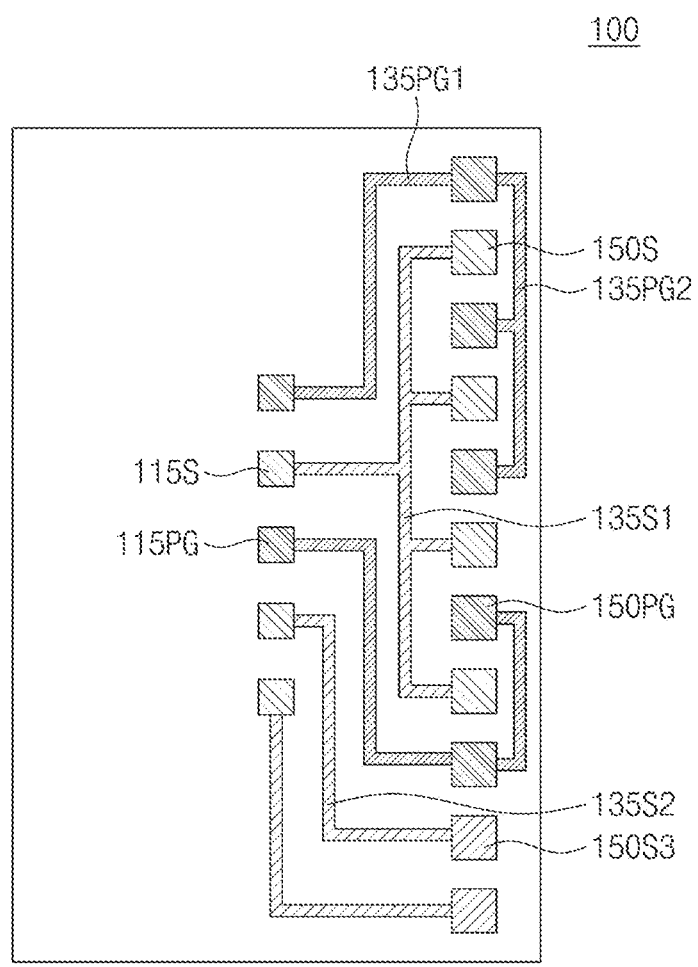
FIG. 6A illustrates a plan view showing a first semiconductor chip, according to example embodiments.

FIG. 6A illustrates a plan view showing a first semiconductor chip according to example embodiments.

Referring to FIG. 6A, the first semiconductor chip 100 may include first signal metal pads 115S, first power/ground metal pads 115PG, a first lower signal redistribution pattern 135S1, first and second lower power/ground redistribution patterns 135PG1 and 135PG2, a plurality of first signal pads 150S, and first power/ground pads 150PG. The first semiconductor chip 100 may further include a second lower signal redistribution pattern 135S2 and a third lower signal pad 150S3. The first semiconductor chip 100 may be substantially the same as that discussed above. For example, the first signal pads 150S may include a first lower signal pad 150S1 and a second lower signal pad 150S2 that are discussed in connection with the examples of FIGS. 1A, 1B, 1D, 1E, and 1F. The first signal pads 150S may be substantially the same as the first lower signal pad 150S1 and the second lower signal pad 150S2 of FIGS. 1A, 1B, 1D, 1E, and 1F. The first lower signal redistribution pattern 135S1 may be coupled to a plurality of first signal pads 150S. For example, the first lower signal redistribution pattern 135S1 may be coupled to at least four first signal pads 150S, but the present inventive concepts are not limited thereto. The first signal pads 150S may be electrically connected through the first lower signal redistribution pattern 135S1 to the first signal metal pad 115S. The first signal pads 150S may be electrically connected to each other through the first lower signal redistribution patterns 135S1.

The first power/ground pads 150PG may be correspondingly provided between the first signal pads 150S.

Figure 6B:
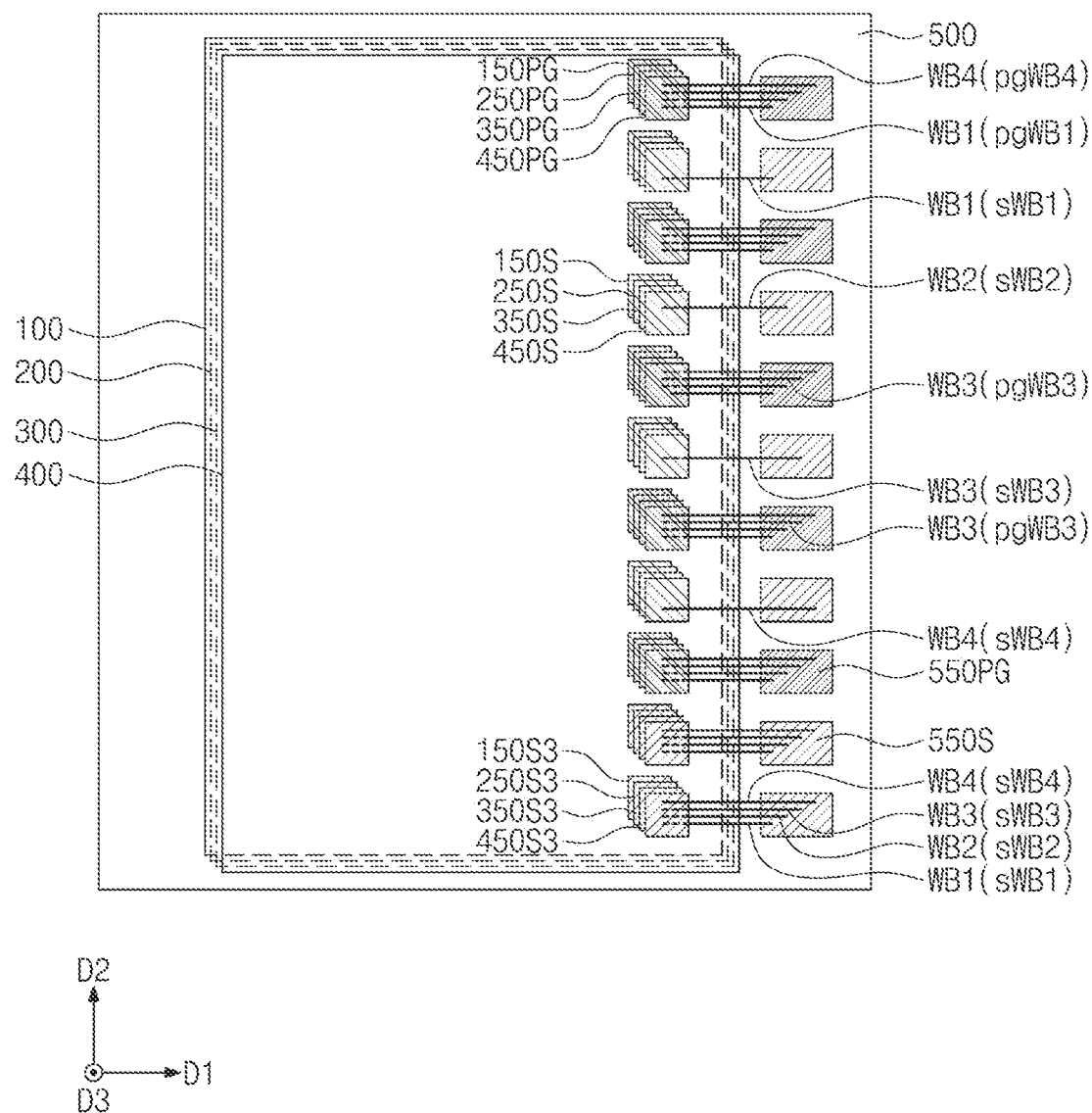
FIG. 6B illustrates a plan view showing a semiconductor package, according to example embodiments.

FIG. 6B illustrates a plan view showing a semiconductor package according to example embodiments. The description of FIG. 6B will refer to FIG. 6A.

Referring to FIG. 6B, a semiconductor package may include a substrate 500, a first semiconductor chip 100, a second semiconductor chip 200, a third semiconductor chip 300, a fourth semiconductor chip 400, first bonding wires WB1, second bonding wires WB2, third bonding wires WB3, and fourth bonding wires WB4. Although not illustrated, the semiconductor package may further include solder balls 600, adhesive layers 710, and a molding layer 700 that are discussed in connection with the examples of FIGS. 1D and 1E.

The first semiconductor chip 100 may be mounted on a top surface of the substrate 500. The first semiconductor chip 100 may be substantially the same as that discussed in connection with the example of FIG. 6A. The second, third, and fourth semiconductor chips 200, 300, and 400 may be stacked on the first semiconductor chip 100. The first, second, third, and fourth semiconductor chips 100, 200, 300, and 400 may be vertically aligned with each other. For example, sidewalls of each of the first, second, third, and fourth semiconductor chips 100, 200, 300, and 400 may be aligned with each other in the vertical direction.

The second, third, and fourth semiconductor chips 200, 300, and 400 may be of the same type as the first semiconductor chip 100. Each of the second, third, and fourth semiconductor chips 200, 300, and 400 may be substantially the same as the first semiconductor chip 100 of FIG. 6A. For example, the second semiconductor chip 200 may include a plurality of second signal pads 250S and second power/ground pads 250PG. The second signal pads 250S may include a first upper signal pad 250S1 and a second upper signal pad 250S2 that are as discussed in connection with the examples of FIGS. 1A, 1C, 1D, 1E, and 1F. The second semiconductor chip 200 may further include third upper signal pads 250S3. The second semiconductor chip 200 may further include second signal metal pads 215S, second power/ground metal pads 215PG, a first upper signal redistribution pattern 235S1, a second upper signal redistribution pattern 235S2, and first and second upper power/ground redistribution patterns 235PG1 and 235PG2 that are discussed in connection with the examples of FIGS. 2A to 2C.

The plurality of second signal pads 250S, the second power/ground pads 250PG, and the third upper signal pads 250S3 may have arrangements, shapes, and electrical connections that are substantially the same as those of the plurality of first signal pads 150S, the first power/ground pads 150PG, and the third lower signal pads 150S3, respectively, that are discussed in FIG. 6A. For example, the plurality of second signal pads 250S may be electrically connected to each other through the first upper signal redistribution pattern (see, e.g., the first upper signal redistribution pattern 235S1 of FIG. 2C). The plurality of second signal pads 250S may be electrically connected through the first upper signal redistribution pattern (see, e.g., the first upper signal redistribution pattern 235S1 of FIG. 2C) to one of the second signal metal pads (see, e.g., the second signal metal pads 215S of FIG. 2C). When viewed in plan, the plurality of second signal pads 250S, the second power/ground pads 250PG, and the third upper signal pads 250S3 may respectively overlap the plurality of first signal pads 150S, the first power/ground pads 150PG, and the second lower signal pads 150S2.

The third semiconductor chip 300 may include third signal metal pads, third power/ground metal pads, a third signal redistribution pattern, third and fourth upper power/ground redistribution patterns, a plurality of third signal pads 350S, fourth upper signal pads 350S3, and third power/ground pads 350PG. The third signal metal pads, the third power/ground metal pads, the third signal redistribution pattern, the third and fourth upper power/ground redistribution patterns, the plurality of third signal pads 350S, the third power/ground pads 350PG, and the fourth upper signal pads 350S3 may have arrangement, shapes, and electrical connections that are substantially the same as those of the first signal metal pads 115S, the first power/ground metal pads 115PG, the first lower signal redistribution pattern 135S1, the first and second lower power/ground redistribution patterns 135PG1 and 135PG2, the plurality of first signal pads 150S, the first power/ground pads 150PG, and the third lower signal pads 150S3, respectively, that are discussed in FIG. 6A. For example, the plurality of third signal pads 350S may be electrically connected to each other through the third signal redistribution pattern. The plurality of third signal pads 350S may be electrically connected through the third signal redistribution pattern to one of the third signal metal pads. The fourth upper signal pads 350S3 may be electrically separated from the third signal pads 350S. The fourth upper signal pads 350S3 may have their signal transmission speeds less than those of the third signal pads 350S. When viewed in plan, the third signal metal pads, the third power/ground metal pads, the third signal redistribution pattern, the third and fourth upper power/ground redistribution patterns, the plurality of third signal pads 350S, the third power/ground pads 350PG, and the fourth upper signal pads 350S3 may respectively overlap the first signal metal pads 115S, the first power/ground metal pads 115PG, the first lower signal redistribution pattern 135S1, the first and second lower power/ground redistribution patterns 135PG1 and 135PG2, the plurality of first signal pads 150S, the first power/ground pads 150PG, and the third lower signal pads 150S3 that are discussed in FIG. 6A.

The fourth semiconductor chip 400 may include fourth signal metal pads, fourth power/ground metal pads, a fourth signal redistribution pattern, fifth and sixth upper power/ground redistribution patterns, a plurality of fourth signal pads 450S, fourth power/ground pads 450PG, and fifth upper signal pads 450S3. The fourth signal metal pads, the fourth power/ground metal pads, the fourth signal redistribution pattern, the fifth and sixth upper power/ground redistribution patterns, the plurality of fourth signal pads 450S, the fourth power/ground pads 450PG, and the fifth upper signal pads 450S3 may have arrangement, shapes, and functions that are substantially the same as those of the first signal metal pads 115S, the first power/ground metal pads 115PG, the first lower signal redistribution pattern 135S1, the first and second lower power/ground redistribution patterns 135PG1 and 135PG2, the plurality of first signal pads 150S, the first power/ground pads 150PG, and the third lower signal pads 150S3, respectively, that are discussed in FIG. 6A. For example, the plurality of fourth signal pads 450S may be electrically connected to each other through the fourth signal redistribution pattern. The plurality of fourth signal pads 450S may be electrically connected through the fourth signal redistribution pattern to one of the fourth signal metal pads. The fifth upper signal pads 450S3 may be electrically separated from the fourth signal pads 450S. The fifth upper signal pads 450S3 may be electrically separated from each other. The fifth upper signal pads 450S3 may have their signal transmission speeds less than those of the fourth signal pads 450S. When viewed in plan, the fourth signal metal pads, the fourth power/ground metal pads, the fourth signal redistribution pattern, the fifth and sixth upper power/ground redistribution patterns, the plurality of fourth signal pads 450S, the fourth power/ground pads 450PG, and the fifth upper signal pads 450S3 may respectively overlap the first signal metal pads 115S, the first power/ground metal pads 115PG, the first lower signal redistribution pattern 135S1, the first and second lower power/ground redistribution patterns 135PG1 and 135PG2, the plurality of first signal pads 150S, the first power/ground pads 150PG, and the third lower signal pads 150S3 that are discussed in FIG. 6A.

The first bonding wires WB1 may be provided on a top surface of the first semiconductor chip 100 and may be electrically connected to the substrate 500. One (e.g., first sub-signal bonding wire) of the first signal bonding wires sWB1 may be provided on and in contact with one (e.g., contact signal pad) of the first signal pads 150S. The first signal bonding wires sWB1 may be spaced apart from top surfaces of remaining first signal pads 150S (e.g., blank signal pads). A remaining one of the first signal pads 150S may be coupled through the first lower signal redistribution pattern 135S1 to a contact signal pad of the first signal pads 150S and to a corresponding first signal metal pad 115S. One or more remaining first signal bonding wires sWB1 (e.g., second sub-signal bonding wire) may be electrically connected to the third lower signal pads 150S3. The first power/ground bonding wires pgWB1 may be in contact with the first power/ground pads 150PG.

The second bonding wires WB2 may be provided on a top surface of the second semiconductor chip 200 and may be electrically connected to the substrate 500. One (e.g., first sub-signal bonding wire) of the second signal bonding wires sWB2 may be provided on and in contact with one (e.g., contact signal pad) of the second signal pads 250S. The second signal bonding wires sWB2 may be spaced apart from top surfaces of remaining second signal pads 250S (e.g., blank signal pads). One or more blank signal pads of the second signal pads 250S may be coupled through the second upper signal redistribution pattern (see, e.g., the second upper signal redistribution pattern 235S of FIG. 2A) to either a contact signal pad of the second signal pads 250S or a corresponding second signal metal pad (see, e.g., second signal metal pad 215S of FIG. 2A). One or more remaining second signal bonding wires sWB2 (e.g., second sub-signal bonding wires) may be correspondingly coupled to the third upper signal pads 250S3. The second power/ground bonding wires pgWB2 may be coupled to the second power/ground pads 250PG.

The third bonding wires WB3 may be provided on a top surface of the third semiconductor chip 300 and may be electrically connected to the substrate 500. One (e.g., first sub-signal bonding wire) of the third signal bonding wires sWB3 may be in contact with a top surface of one (e.g., contact signal pad) of the third signal pads 350S. The third signal bonding wires sWB3 may not be provided on top surfaces of remaining third signal pads 350S (or blank signal pads). One or more blank signal pads of the third signal pads 350S may be coupled through the third supper signal redistribution pattern either to one or more contact signal pads of the third signal pads 350S or to a corresponding third signal metal pad. One or more remaining third signal bonding wires sWB3 (e.g., second sub-signal bonding wires) may be correspondingly coupled to the fourth upper signal pads 350S3. The third power/ground bonding wires pgWB3 may be coupled to the third power/ground pads 350PG.

The fourth bonding wires WB4 may be provided on a top surface of the fourth semiconductor chip 400 and may be electrically connected to the substrate 500. One (e.g., first sub-signal bonding wire) of the fourth signal bonding wires sWB4 may be in contact with a top surface of one (e.g., contact signal pad) of the fourth signal pads 450S. The fourth signal bonding wires sWB4 may be spaced apart from top surfaces of remaining fourth signal pads 450S (e.g., blank signal pads). One or more remaining fourth signal pads 450S may be coupled through the fourth upper signal redistribution pattern to the one fourth signal pad 450S or a corresponding fourth signal metal pad. One or more remaining fourth signal bonding wires sWB4 (e.g., second sub-signal bonding wires) may be correspondingly coupled to the fifth upper signal pads 450S3. The fourth power/ground bonding wires pgWB4 may be coupled to the fourth power/ground pads 450PG.

When viewed in plan, the first signal pads 150S may overlap the second signal pads 250S, the third signal pads 350S, and the fourth signal pads 450S. When viewed in plan, a contact signal pad of the first signal pads 150S may overlap a corresponding blank signal pad of the second signal pads 250S, a corresponding blank signal pad of the third signal pads 350S, and a corresponding blank signal pad of the fourth signal pads 450S. Therefore, when viewed in plan, a first sub-signal bonding wire of the first signal bonding wires sWB1 may not overlap any of the second signal bonding wires sWB2, the third signal bonding wires sWB3, and the fourth signal bonding wires sWB4. Accordingly, the occurrence of crosstalk may be prevented between the first, second, third, and fourth signal bonding wires sWB1, sWB2, sWB3, and sWB4.

When viewed in plan, a contact signal pad of the second signal pads 250S may overlap a corresponding blank signal pad of the first signal pads 150S, a corresponding blank signal pad of the third signal pads 350S, and a corresponding blank signal pad of the fourth signal pads 450S. Therefore, when viewed in plan, a first sub-signal bonding wire of the second signal bonding wires sWB2 may not overlap any of the first signal bonding wires sWB1, the third signal bonding wires sWB3, and the fourth signal bonding wires sWB4.

When viewed in plan, a contact signal pad of the third signal pads 350S may overlap a corresponding blank signal pad of the first signal pads 150S, a corresponding blank signal pad of the second signal pads 250S, and a corresponding blank signal pad of the fourth signal pads 450S. Therefore, when viewed in plan, a first sub-signal bonding wire of the third signal bonding wires sWB3 may not overlap any of the first signal bonding wires sWB1, the second signal bonding wires sWB2, and the fourth signal bonding wires sWB4.

When viewed in plan, a contact signal pad of the fourth signal pads 450S may overlap a corresponding blank signal pad of the first signal pads 150S, a corresponding blank signal pad of the second signal pads 250S, and a corresponding blank signal pad of the third signal pads 350S. Therefore, when viewed in plan, a first sub-signal bonding wire of the fourth signal bonding wires sWB4 may not overlap any of the first signal bonding wires sWB1, the second signal bonding wires sWB2, and the third signal bonding wires sWB3. Accordingly, the occurrence of crosstalk may be further prevented between the first, second, third, and fourth signal bonding wires sWB1, sWB2, sWB3, and sWB4. The semiconductor package may have improved operating reliability.

The semiconductor package may include the first, second, third, and fourth semiconductor chips 100, 200, 300, and 400, and as illustrated in FIG. 6A, at least four first signal pads 150S may be electrically connected to each other through the first lower signal redistribution pattern 135S1. At least four second signal pads 250S may be electrically connected to each other through a first upper redistribution pattern. At least four second signal pads 250S may be electrically connected to each other through a second upper redistribution pattern. At least four second signal pads 250S may be electrically connected to each other through a fourth upper redistribution pattern.

The first, second, third, and fourth power/ground bonding wires pgWB1, pgWB2, pgWB3, and pgWB4 may be correspondingly provided between two neighboring ones of a first sub-signal bonding wire of the first signal bonding wires sWB1, a first sub-signal bonding wire of the second signal bonding wires sWB2, a first sub-signal bonding wire of the third signal bonding wires sWB3, and a first sub-signal bonding wire of the fourth signal bonding wires sWB4. Accordingly, the occurrence of crosstalk may be further reduced or prevented between the first, second, third, and fourth signal bonding wires sWB1, sWB2, sWB3, and sWB4. The semiconductor package may have improved electrical properties.

Each of the power/ground substrate pads 550PG may be coupled to a corresponding first power/ground bonding wire pgWB1, a corresponding second power/ground bonding wire pgWB2, a corresponding third power/ground bonding wire pgWB3, and a corresponding fourth power/ground bonding wire pgWB4.

The number of stacked semiconductor chips 100, 200, 300, and 400 is not limited to that shown, but may be variously changed. The semiconductor package may further include solder balls 600, adhesive layers 710, and a molding layer 700 that are discussed in connection with the examples of FIGS. 1D and 1E.

Figure 6C:
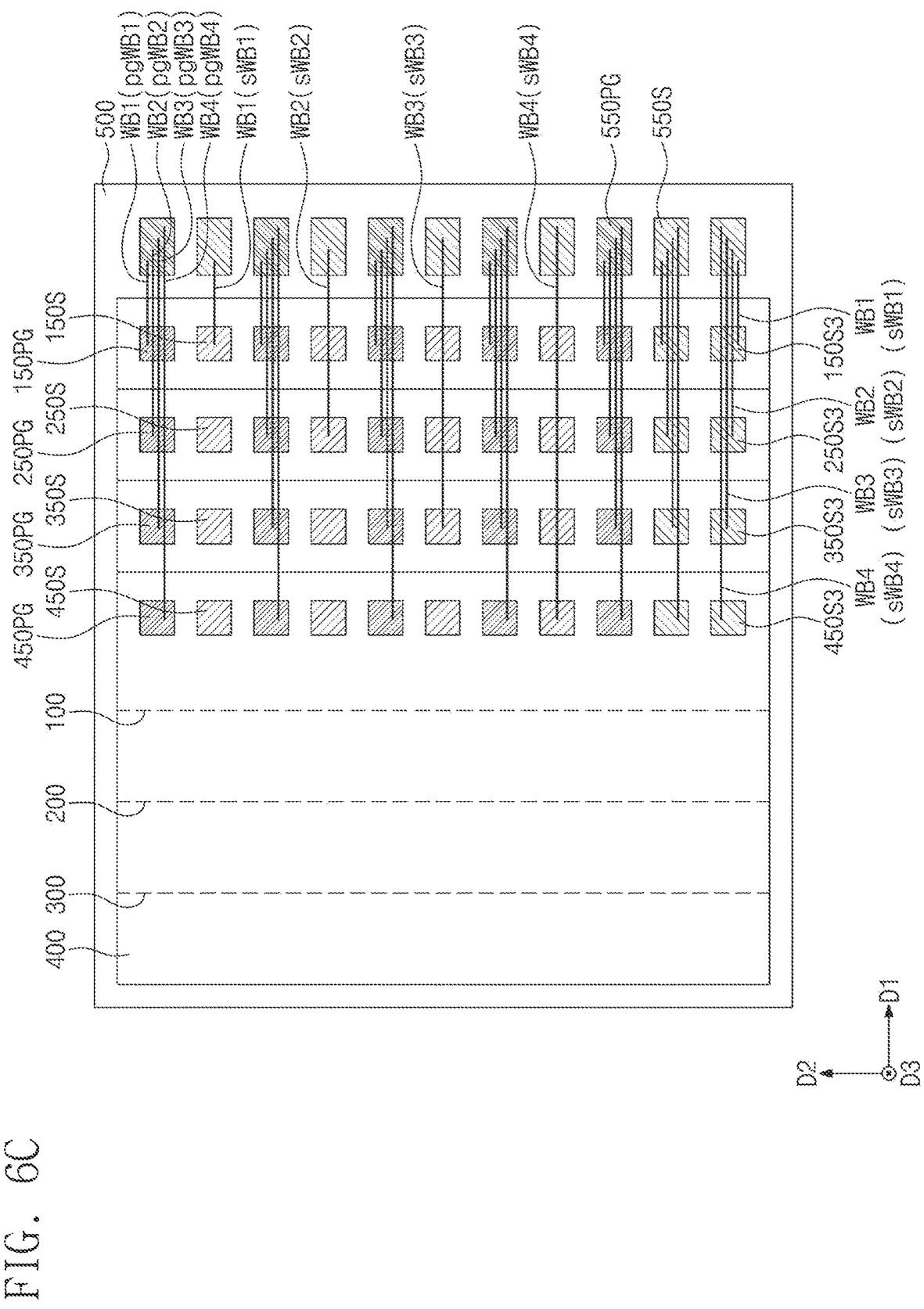
FIG. 6C illustrates a plan view showing a semiconductor package, according to example embodiments.

FIG. 6C illustrates a plan view showing a semiconductor package according to some embodiments. The description of FIG. 6C will refer to FIG. 6A.

Referring to FIG. 6C, a semiconductor package may include a substrate 500, a first semiconductor chip 100, a second semiconductor chip 200, a third semiconductor chip 300, a fourth semiconductor chip 400, first bonding wires WB1, second bonding wires WB2, third bonding wires WB3, and fourth bonding wires WB4. The substrate 500, the first to fourth semiconductor chips 100 to 400, and the first to fourth bonding wires WB1 to WB4 may be substantially the same as those discussed in connection with the examples of FIGS. 6A and 6B. The second semiconductor chip 200 may be disposed shifted from the first semiconductor chip 100 in a direction opposite to the first direction D1. The first signal pads 150S, the first power/ground pads 150PG, and the third lower signal pads 150S3 may be spaced apart from the second semiconductor chip 200.

The third semiconductor chip 300 may be disposed shifted from the second semiconductor chip 200 in a direction opposite to the first direction D1. The third semiconductor chip 300 may expose the second signal pads 250S, the second power/ground pads 250PG, and the third upper signal pads 250S3.

The fourth semiconductor chip 400 may be disposed shifted from the third semiconductor chip 300 in a direction opposite to the first direction D1. The fourth semiconductor chip 400 may expose the fourth signal pads 450S, the fourth power/ground pads 450PG, and the fourth upper signal pads 350S3.

The semiconductor package may further include solder balls 600, adhesive layers 710, and a molding layer 700 that are discussed in connection with the examples of FIGS. 1D and 1E.

According to the present inventive concepts, a power/ground bonding wire may be provided between signal bonding wires. The signal bonding wires may not vertically overlap each other. Therefore, the occurrence of crosstalk may be prevented between the signal bonding wires. A semiconductor package may have improved operating reliability and increased electrical properties.

This detailed description of the present inventive concepts should not be construed as limited to the embodiments set forth herein, and it is intended that the present inventive concepts cover the various combinations, the modifications and variations of this invention without departing from the spirit and scope of the present inventive concepts.

What is claimed is:

1. A semiconductor package, comprising:
   a substrate that includes a plurality of substrate pads on a top surface of the substrate;
   a first semiconductor chip on the substrate;
   a second semiconductor chip on the first semiconductor chip; and
   a plurality of first bonding wires on a top surface of the first semiconductor chip and coupled to the substrate pads,
   wherein the first semiconductor chip includes:
      a first lower signal pad;
      a second lower signal pad laterally spaced apart from the first lower signal pad; and
      a lower signal redistribution pattern electrically connected to the first lower signal pad and the second lower signal pad,
   wherein the lower signal redistribution pattern extends below a lower surface of the first lower signal pad and a lower surface of the second lower signal pad,
   wherein one of the first bonding wires is coupled to the first lower signal pad, and
   wherein any of the first bonding wires is not on a top surface of the second lower signal pad.

2. The semiconductor package of claim 1,
   wherein the first semiconductor chip further includes a first power/ground pad on the top surface of the first semiconductor chip, and
   wherein the first power/ground pad is between the first lower signal pad and the second lower signal pad.

3. The semiconductor package of claim 1, further comprising:
   a plurality of second bonding wires on a top surface of the second semiconductor chip and coupled to the substrate,
   wherein the second semiconductor chip includes:
      a first upper signal pad;
      a second upper signal pad spaced apart from the first upper signal pad; and
      an upper signal redistribution pattern electrically connected to the first upper signal pad and the second upper signal pad,
   wherein the second bonding wires include a second signal bonding wire coupled to the second upper signal pad, and
   wherein any of the second bonding wires is not on a top surface of the first upper signal pad.

4. The semiconductor package of claim 3, wherein the second signal bonding wire overlaps the first lower signal pad when viewed in plan and is vertically spaced apart from the first lower signal pad.

5. The semiconductor package of claim 3, wherein any of the first bonding wires does not vertically overlap the second signal bonding wire.

6. The semiconductor package of claim 3,
   wherein the second semiconductor chip further includes a second power/ground pad on the top surface of the second semiconductor chip, and
   wherein the second power/ground pad is between the first upper signal pad and the second upper signal pad.

7. The semiconductor package of claim 3,
   wherein when viewed in plan, the first upper signal pad overlaps the first lower signal pad, and
   wherein when viewed in plan, the second upper signal pad overlaps the second lower signal pad.

8. The semiconductor package of claim 1, wherein the first semiconductor chip further includes:
a first semiconductor substrate;
a first signal metal pad on the first semiconductor substrate; and
a first redistribution layer on the first semiconductor substrate,
wherein the first redistribution layer includes the lower signal redistribution pattern,
wherein the lower signal redistribution pattern is coupled to the first signal metal pad, and
wherein the first lower signal pad and the second lower signal pad are on a top surface of the first redistribution layer.

9. A semiconductor package, comprising:
a substrate that includes a plurality of substrate pads on a top surface of the substrate;
a first semiconductor chip on the substrate, the first semiconductor chip including a first lower signal pad, a second lower signal pad, and a lower redistribution pattern;
a second semiconductor chip on the first semiconductor chip, the second semiconductor chip including a first upper signal pad, a second upper signal pad, and an upper redistribution pattern;
a plurality of first bonding wires on a top surface of the first semiconductor chip and coupled to the substrate; and
a plurality of second bonding wires on a top surface of the second semiconductor chip and coupled to the substrate,
wherein the lower redistribution pattern is electrically connected to the first lower signal pad and the second lower signal pad,
wherein the lower redistribution pattern extends below a bottom surface of the first lower signal pad and a bottom surface of the second lower signal pad,
wherein the upper redistribution pattern is electrically connected to the first upper signal pad and the second upper signal pad,
wherein the first bonding wires are spaced apart from the second lower signal pad, and
wherein the second bonding wires are spaced apart from the first upper signal pad.

10. The semiconductor package of claim 9,
wherein the first bonding wires include a first signal bonding wire coupled to the first lower signal pad, and
wherein the second bonding wires include a second signal bonding wire coupled to the second upper signal pad.

11. The semiconductor package of claim 10, wherein the second signal bonding wire is vertically spaced apart from a top surface of the first lower signal pad.

12. The semiconductor package of claim 10, wherein the first signal bonding wire does not vertically overlap the second bonding wires.

13. The semiconductor package of claim 9,
wherein the first semiconductor chip further includes a power/ground pad on the top surface of the first semiconductor chip, and
wherein the power/ground pad is between the first lower signal pad and the second lower signal pad.

14. The semiconductor package of claim 9,
wherein the first bonding wires are not in contact with a top surface of the second lower signal pad, and
wherein the second bonding wires are not in contact with a top surface of the first upper signal pad.

15. The semiconductor package of claim 9,
wherein when viewed in plan, the second semiconductor chip is shifted in one direction from the first semiconductor chip,
wherein the substrate pads include a signal substrate pad coupled to the first lower signal pad, and
wherein when viewed in plan, the first lower signal pad is between the first upper signal pad and the signal substrate pad.

16. A semiconductor package, comprising:
a substrate that includes a plurality of substrate pads on a top surface of the substrate, the substrate pads including a plurality of signal substrate pads and a plurality of power/ground substrate pads;
a plurality of solder balls on a bottom surface of the substrate;
a first semiconductor chip on the top surface of the substrate;
a second semiconductor chip on a top surface of the first semiconductor chip;
a plurality of first bonding wires on the top surface of the first semiconductor chip and coupled to the substrate;
a plurality of second bonding wires on a top surface of the second semiconductor chip and coupled to the substrate; and
a molding layer on the top surface of the substrate, the molding layer covering the first and second semiconductor chips,
wherein the first semiconductor chip includes:
a first lower signal pad;
a second lower signal pad laterally spaced apart from the first lower signal pad;
a lower redistribution pattern coupled to the first and second lower signal pads; and
a first power/ground pad insulated from the first and second lower signal pads,
wherein the second semiconductor chip includes:
a first upper signal pad;
a second upper signal pad laterally spaced apart from the first upper signal pad;
an upper redistribution pattern coupled to the first and second upper signal pads; and
a second power/ground pad insulated from the first and second upper signal pads,
wherein the second bonding wires include a second signal bonding wire connected to the second upper signal pad, and
wherein the second bonding wires are spaced apart from the first upper signal pad.

17. The semiconductor package of claim 16,
wherein the second signal bonding wire is vertically spaced apart from a top surface of the first lower signal pad, and
wherein the first bonding wires are not between the second signal bonding wire and the first lower signal pad.

18. The semiconductor package of claim 16,
wherein the first bonding wires include a first signal bonding wire coupled to the first lower signal pad, and
wherein any of the first bonding wires is not in contact with a top surface of the second lower signal pad.

19. The semiconductor package of claim 16,
wherein the first power/ground pad is between the first lower signal pad and the second lower signal pad, and
wherein the second power/ground pad is between the first upper signal pad and the second upper signal pad.

20. The semiconductor package of claim 16, wherein the first semiconductor chip further includes:
- a first signal metal pad on a first semiconductor substrate; and
- a first redistribution layer on the first semiconductor substrate, the first redistribution layer including the lower redistribution pattern,
- wherein the lower redistribution pattern is coupled to the first signal metal pad,
- wherein the second semiconductor chip further includes:
  - a second signal metal pad on a second semiconductor substrate; and
  - a second redistribution layer on the second semiconductor substrate, the second redistribution layer including the upper redistribution pattern, and
- wherein the upper redistribution pattern is coupled to the second signal metal pad.

* * * * *